(12) United States Patent
Chevalier et al.

(10) Patent No.: US 11,973,306 B2
(45) Date of Patent: Apr. 30, 2024

(54) WIDELY TUNABLE COMPACT TERAHERTZ GAS LASERS

(71) Applicants: PRESIDENT AND FELLOWS OF HARVARD COLLEGE, Cambridge, MA (US); Massachusetts Institute of Technology, Cambridge, MA (US); The United States of America as Represented by the Secretary of the Army, Huntsville, AL (US); Henry O. Everitt, Huntsville, AL (US)

(72) Inventors: Paul Chevalier, Cambridge, MA (US); Arman Amirzhan, Cambridge, MA (US); Marco Piccardo, Cambridge, MA (US); Fan Wang, Cambridge, MA (US); Steven Glen Johnson, Cambridge, MA (US); Henry O. Everitt, Huntsville, AL (US); Federico Capasso, Cambridge, MA (US)

(73) Assignees: PRESIDENT AND FELLOWS OF HARVARD COLLEGE, Cambridge, MA (US); Massachusetts Institute of Technology, Cambridge, MA (US); The United States of America as Represented by the Secretary of the Army, Huntsville, AL (US)

( * ) Notice: Subject to any disclaimer, the term of this patent is extended or adjusted under 35 U.S.C. 154(b) by 19 days.

(21) Appl. No.: 17/776,547

(22) PCT Filed: Nov. 12, 2020

(86) PCT No.: PCT/US2020/060299
§ 371 (c)(1),
(2) Date: May 12, 2022

(87) PCT Pub. No.: WO2021/097140
PCT Pub. Date: May 20, 2021

(65) Prior Publication Data
US 2022/0399696 A1 Dec. 15, 2022

Related U.S. Application Data

(60) Provisional application No. 62/935,055, filed on Nov. 13, 2019.

(51) Int. Cl.
*H01S 3/092* (2006.01)
*H01S 3/0941* (2006.01)
(Continued)

(52) U.S. Cl.
CPC ........ *H01S 3/1312* (2013.01); *H01S 3/09415* (2013.01); *H01S 3/223* (2013.01); *H01S 2302/02* (2013.01)

(58) Field of Classification Search
CPC .... H01S 3/1312; H01S 3/09415; H01S 3/223; H01S 2302/02; H01S 3/034; H01S 3/105;
(Continued)

(56) References Cited

U.S. PATENT DOCUMENTS 3,564,449 A * 2/1971 Muller et al. ........... H01S 3/223
372/4
3,596,202 A 7/1971 Patel et al.
(Continued)

OTHER PUBLICATIONS

International Search Report and Written Opinion for International Patent Application No. PCT/US2020/060299, dated Feb. 5, 2021, 6 pages.

*Primary Examiner* — Kinam Park
(74) *Attorney, Agent, or Firm* — FOLEY & LARDNER LLP

(57) ABSTRACT

Disclosed is a laser system including a first laser and a second laser. The first laser includes a laser cavity, and a gas phase molecular gain medium disposed in the laser cavity,
(Continued)

the gain medium having an absorption band. The second laser is a solid state laser configured to be continuously tunable, with respect to an emission wavelength of the second laser, over the absorption band of the gain medium, and the second laser is tuned to pump rotational vibrational transitions in the gain medium to achieve a rotational population inversion.

20 Claims, 15 Drawing Sheets

(51) Int. Cl.
*H01S 3/131* (2006.01)
*H01S 3/223* (2006.01)

(58) Field of Classification Search
CPC ........ H01S 3/134; H01S 3/2232; H01S 3/104; H01S 5/3401; H01S 5/4031
See application file for complete search history.

(56) References Cited

U.S. PATENT DOCUMENTS

| | | | |
|---|---|---|---|
| 5,020,061 A | 5/1991 | Etievant et al. | |
| 5,701,396 A | 12/1997 | Liedenbaum et al. | |
| 6,331,993 B1* | 12/2001 | Brown | H01S 3/09415 |
| | | | 372/71 |
| 8,837,550 B2* | 9/2014 | Shapira | H01S 3/091 |
| | | | 372/53 |
| 9,153,928 B2* | 10/2015 | Fermann | G01N 21/4795 |
| 9,246,310 B2 | 1/2016 | Goyal et al. | |
| 2013/0202006 A1* | 8/2013 | Rudolph | H01S 3/06741 |
| | | | 372/55 |
| 2018/0254596 A1* | 9/2018 | Lampin | H01S 3/0941 |

* cited by examiner

WIDELY TUNABLE COMPACT TERAHERTZ GAS LASERS

CROSS-REFERENCE TO RELATED PATENT APPLICATIONS

This application is a National Stage Entry of International Application No. PCT/US2020/060299, filed on Nov. 12, 2020, which claims the benefit and priority of U.S. Provisional Patent Application No. 62/935,055, filed on Nov. 13, 2019, the contents of which are incorporated herein by reference in their entirety.

STATEMENT OF FEDERALLY SPONSORED RESEARCH OR DEVELOPMENT

This invention is made with Government support, including support by the U.S. Army Research Office under contracts W911NF-19-2-0168 and W911NF-18-2-0048, by the Materials Research Science and Engineering Center Program of the National Science Foundation under award DMR-1419807, and by the National Science Foundation under award ECCS-1614631. This work was performed in part at Harvard Center for Nanoscale Systems (CNS), a member of the National Nanotechnology Coordinated Infrastructure Network (NNCI), which is supported by the National Science Foundation under NSF Award No. 1541959.

BACKGROUND

One problem of generating terahertz frequency radiation (0.3-3.0 terahertz (THz))—in "the middle" of the electromagnetic spectrum between the radio/microwave and infrared (IR) regions—has challenged researchers for decades. Not only would wireless communications and radar benefit from operating in the terahertz region, due to appealing characteristics such as high bandwidth, high spatial resolution, compact size, and/or adjustable atmospheric propagation, so would applications requiring stable local oscillators, such as spectroscopy and astronomical observations of the interstellar media. Among techniques developed to generate terahertz radiation, some used include harmonic multipliers of tunable microwave sources, vacuum electronics (backward-wave oscillators, gyrotrons, and carcinotrons), supercontinua generated by ultrafast lasers and photoconductive switches, and difference-frequency mixing of tunable continuous-wave lasers. Commercial versions of each of these terahertz sources are increasingly available and powerful, but none of them produce much power above 1 THz, and their cost and idiosyncrasies have prevented widespread adoption. Terahertz quantum cascade lasers are compact and can span portions of the region, but they currently have limited fractional tunability (<25%), have low power below 3 THz and require bulky cryogenic cooling to operate.

SUMMARY

The terahertz region of the electromagnetic spectrum has been the least utilized due to inadequacies of available sources. Herein is introduced a compact (e.g., less than the size or volume of a shoe-box (about 20 centimeters long, about 10 centimeters wide, and about 10 centimeters high)), widely frequency-tunable, extremely bright source of terahertz radiation: a gas-phase molecular laser based on rotational population inversions optically pumped by a quantum cascade laser. By identifying the parameters that determine the suitability of a molecule for a terahertz laser, almost any rotational transition of almost any molecular gas can be made to lase. Nitrous oxide is used to illustrate the broad tunability over 39 lines spanning 0.251-0.995 THz, each with kilohertz linewidths. The present analysis demonstrates that laser lines spanning more than 1 THz with powers greater than 1 mW are possible from many molecular gases pumped by quantum cascade lasers.

Often overlooked is one of the earliest sources of terahertz radiation, optically pumped far-infrared (OPFIR) lasers. These gas-phase lasers use a discretely line-tunable carbon-dioxide ($CO_2$) laser to excite a specific rotational-vibrational transition in a specific molecular gas to create a rotational population inversion within a tunable cavity. These lasers generate significant power (up to 100 mW) and exhibit a narrow linewidth ($\Delta\nu$<10 kHz), a combination of features that is not available with most other terahertz sources. However, certain OPFIR lasers are inefficient, quite large (~1 m), and require an equally large $CO_2$ laser and high-voltage power supply. Moreover, they are poorly tunable, requiring the laser gas and $CO_2$ laser line to be changed each time a new frequency is used. Consequently, OPFIR lasers fell from widespread use when those other sources became available.

The present disclosure introduces a revolutionary OPFIR laser concept characterized by unprecedented frequency tunability over a wide range of rotational transitions using a single molecular gas as the gain medium. Broad terahertz tunability is made possible by using a continuously tunable mid-infrared pump source, the quantum cascade laser (QCL). A tunable QCL can optically pump almost any rotational vibrational transition $J_L \rightarrow J_U$ of almost any molecule, not just a rare coincidence afforded by a specific $CO_2$ laser line with a specific transition in a specific molecule, thereby promoting population into a virtually empty excited vibrational level. Sufficient pumping of $J_U$ by the QCL inverts the rotational transition $J_U \rightarrow J_U-1$ and induces this "direct" transition to lase at a frequency of approximately $\nu=2BJ_U$, where B is the rotational constant of the molecule. The rotational quantum number $J_U$ is selected by the type of rotational vibrational transition excited by the QCL: for P-, Q-, and R-branch transitions, $J_U=J_L-1$, $J_L$, and $J_L+1$, respectively. With sufficient QCL power, it is also possible to induce the "refilling" transition $J_L+1 \rightarrow J_L$ to lase, effectively doubling the number of laser lines for a given molecular gas.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Figure 1A:
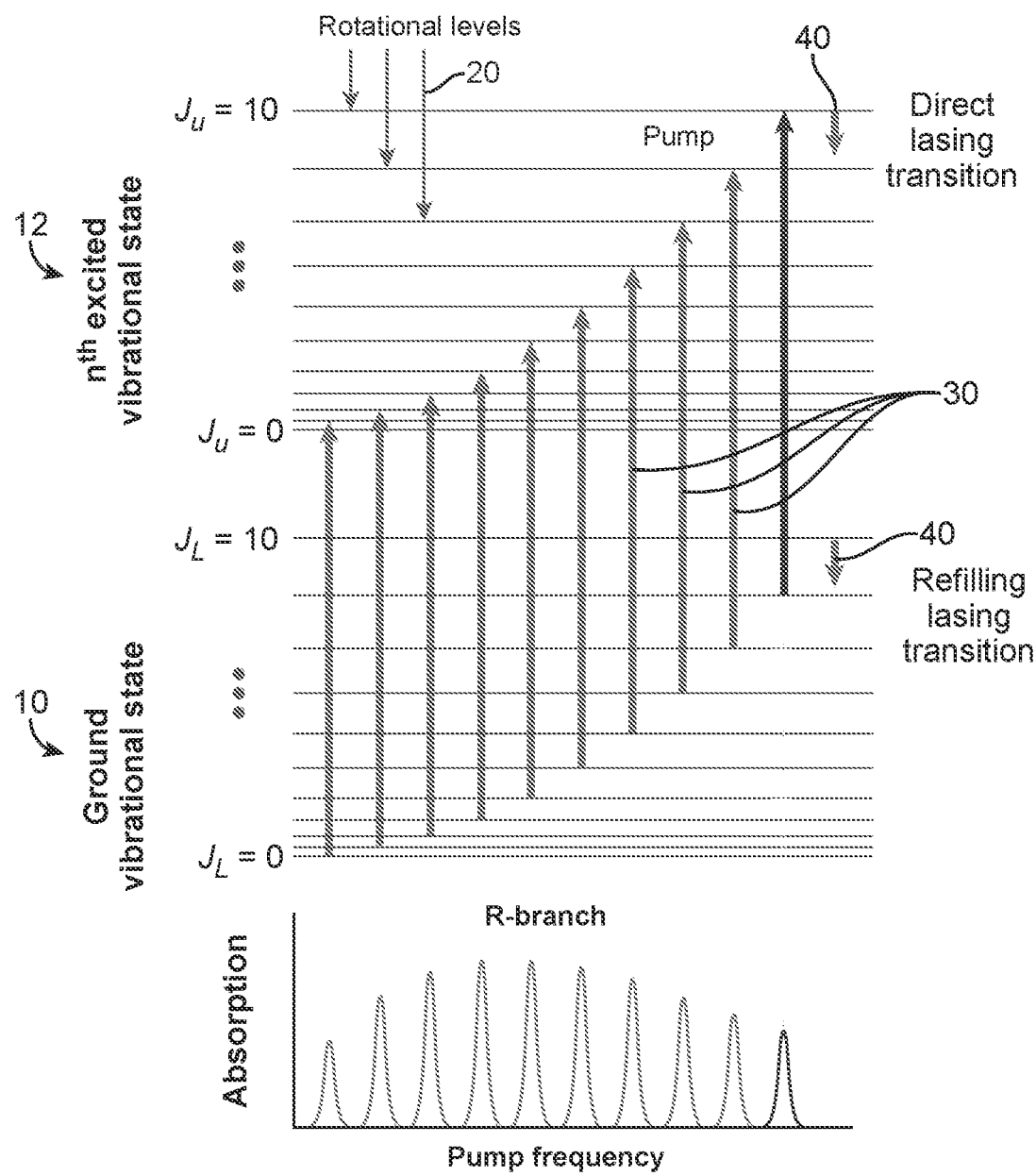
FIGS. 1A and 1B are diagrams illustrating lasing transitions, according to an example embodiment.

The QCL-pumped molecular laser (QPML) disclosed herein is a universal concept: any molecule with a permanent dipole moment and a vapor pressure can be made to lase on any rotational transition if a QCL can be tuned across the corresponding IR band of the molecule. Although QCL-pumped systems are described herein by way of example, the systems and methods disclosed herein are more broadly applicable to solid-state-laser-pumped systems. In various embodiments, terahertz lasing may be achieved on three $NH_3$ pure inversion transitions near 1.0 THz. The systems and methods of the present disclosure may improve upon existing systems by expanding the tuning range of existing systems. The laser of the present disclosure shows theoretically and experimentally that the QPML tuning range can be much broader than existing systems such as a 200% fractional tunability covering the entire span of a molecule's rotational spectrum. The principle of QPML operation is shown in FIG. 1A. FIG. 1A shows the different rotational levels 20 of a molecule for both the ground 10 and excited 12 vibrational states. The up arrows 30 illustrate various R-branch transitions between rotational levels $J_L$ and $J_U$ responsible for the rotational vibrational absorption spectrum of the molecule. The population of each rotational level of the ground vibrational state determines the magnitude of the IR pump absorption. The down arrows 40 indicate how the gas can lase at frequencies corresponding to an inversion between two rotational states in the excited ("direct") or ground ("refilling") vibrational level. The frequency of the laser emission increases with increasing $J_U$ and $J_L$, respectively.

Figure 1B:
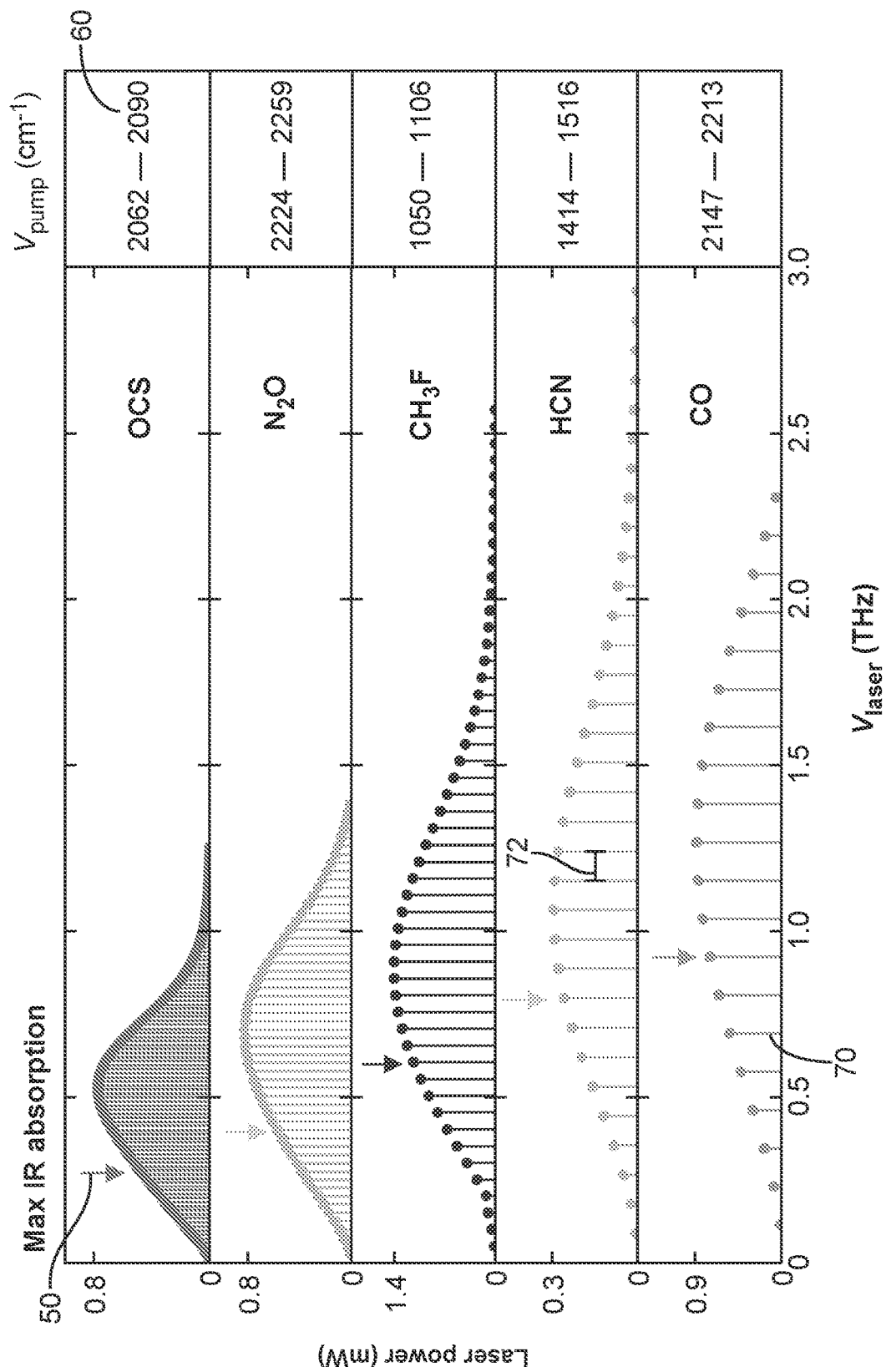

FIG. 1B illustrates the predicted tuning range for several simple molecules (OCS, $N_2O$, $CH_3F$, HCN, CO). FIG. 1B shows the Quantum Cascade Laser-Pumped Molecular Laser (QPML) tuning range and estimated power from direct transitions for 20 mTorr of various molecular gases in a compact cylindrical cavity pumped by a 0.25 W QCL: Carbonyl sulfide (OCS), Nitrous oxide ($N_2O$), Methyl fluoride ($CH_3F$), Hydrogen cyanide (HCN), and Carbon monoxide (CO). The arrow 50 indicates the laser transition corresponding to a pump transition from the rotational level with maximum population, illustrating how the Manley-Rowe effect skews the peak power to higher frequency. Also listed is the QCL tuning range 60 used to pump the associated R-branch transitions.

The spacing 72 of the laser lines 70 can be twice the principal rotational constant B, which is inversely proportional to the principal moment of inertia of the molecule for the vibrational level excited by the QCL. Thus a low moment of inertia molecule like CO has sparser spacing, a broader tuning range, and a peak emission intensity at a high frequency, while a higher moment of inertia molecule like OCS has a denser spacing, a narrower tuning range 60, and a peak at a lower frequency. The number of available transitions increases as the molecular symmetry decreases and molecular mass increases. Virtually any rotational transition can be induced to lase in this manner, so if a laser is to be established at a specific frequency, the appropriate molecular gas may be identified by consulting a catalog of such rotational transitions.

Figure 2A:
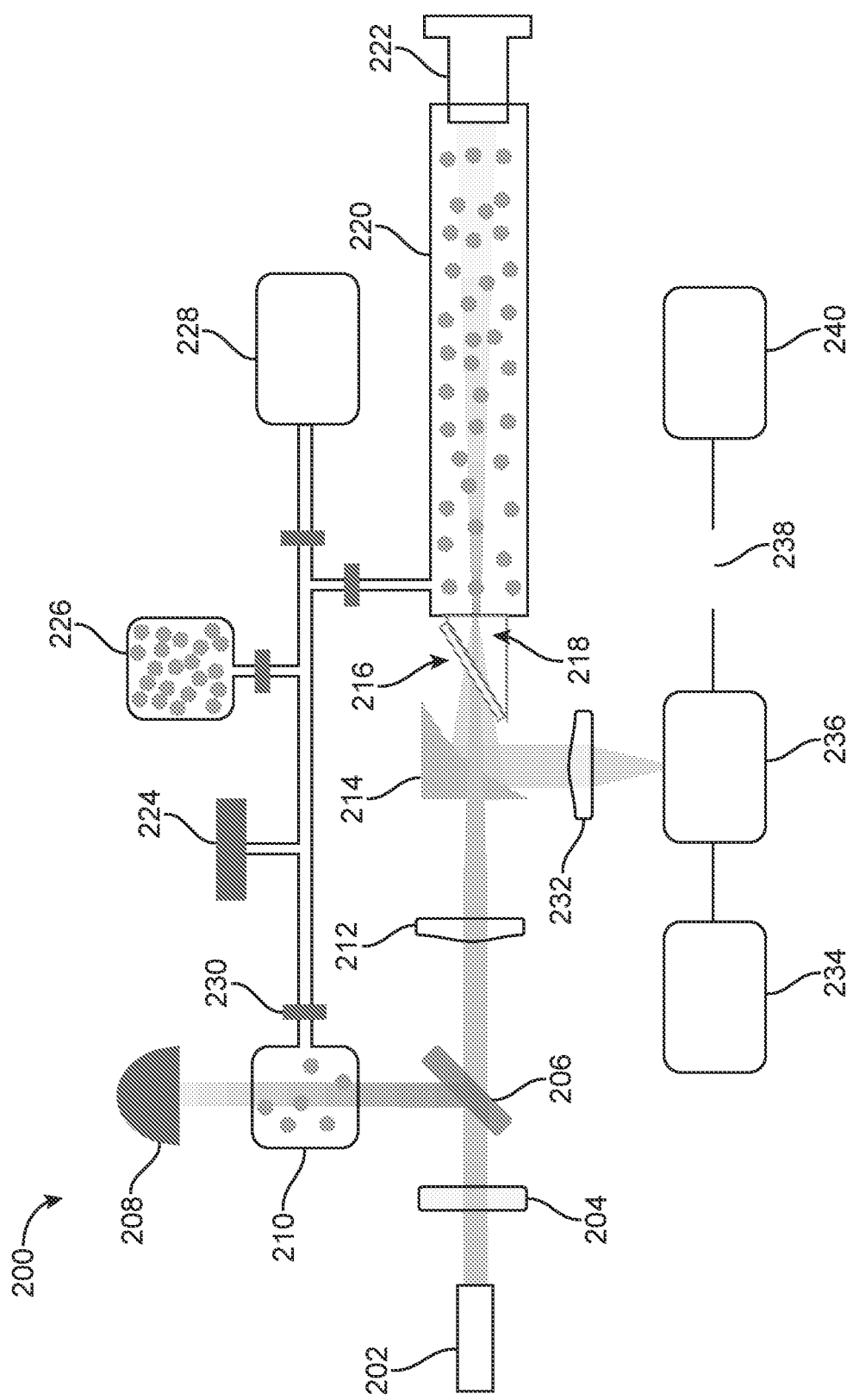
FIGS. 2A, 2B, 2C, 2D, and 2E illustrate an experimental setup for a laser, predicted results, and measured results, according to an example embodiment.

FIG. 2A shows an experimental setup: IR light from a widely tunable QCL is tuned to pump a vibrational transition and create a rotational population inversion, thus realizing a QCL pumped molecular laser (QPML). Light from the QCL is deflected by a 90%-10% beam splitter (BS) and transmitted through a gas cell so that the QCL may be tuned into coincidence with the vibrational transition by minimizing the transmitted intensity measured using a photodiode (PD). Light is coupled into the laser cavity through a hole in an off-axis parabolic mirror (OAP), through a ZnSe window at Brewster's angle, and through a pinhole coupler in the cavity. A vacuum pump, pressure sensor, and gas reservoir are used to set the pressure in both the laser cavity and the gas cell. The radiation emitted from the pinhole of the QPML is collected with the OAP, sent through a Teflon lens, and measured by a power meter, a detector, or a receiver which uses a frequency-multiplied local oscillator (LO) mixed with the signal to produce the intermediate frequency (IF) measured by a spectrum analyzer. The pump power from the QCL is varied using a wire grid polarizer on a calcium fluoride substrate. The laser cavity is tuned into resonance with the lasing frequency by moving a copper mirror on a translation stage.

Specifically, FIG. 2A depicts a QPML 200 that includes: a QCL 202, a polarizer 204, a beamsplitter 206, a photodiode 208, a gas cell 210, a ZnSe lens 212, an OAP 214, a ZnSe window 216, a pinhole coupler 218, a laser cavity 220, a movable mirror 222, a pressure sensor 224, a gas reservoir 226, a vacuum pump 228, valves 230 (a legend in FIG. 2A shows a symbol used to represent the valves 230), a THz lens 232, a local oscillator 234, a mixer 236, an intermediate frequency 238, and a spectrum analyzer 240. In an alternative scheme discussed below, 236 can be a Schottky diode THz detector or a THz power meter where 234, 238 and 240 are no longer present. The compact QPML configuration illustrated in FIG. 2A includes aspects of a cavity design: a 5 mm diameter, 15 cm long evacuated copper tube into which is inserted a copper rod rear reflector with a curved face that can be longitudinally scanned within the cavity until the cavity mode overlaps the gain profile. The output coupler is a 1 mm diameter pinhole in a flat front plate through which both the QCL and QPML beams propagated. The IR beam from the QCL was focused by a 15 cm focal length lens through a Brewster-angled ZnSe window to maximize power into the cavity (typically ~85%), while the terahertz beam diffracted through the pinhole and was refocused by an off-axis parabolic mirror and a Teflon lens into a room temperature power meter, a Schottky-diode detector, or a receiver (Virginia Diodes, Inc.) operating in the frequency band of interest between 0.22 and 1.1 THz.

Figure 2B:
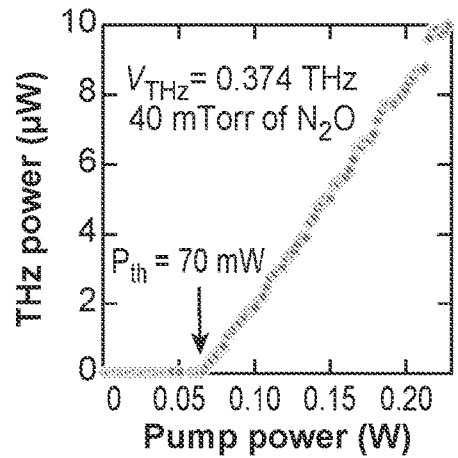
Figure 2C:
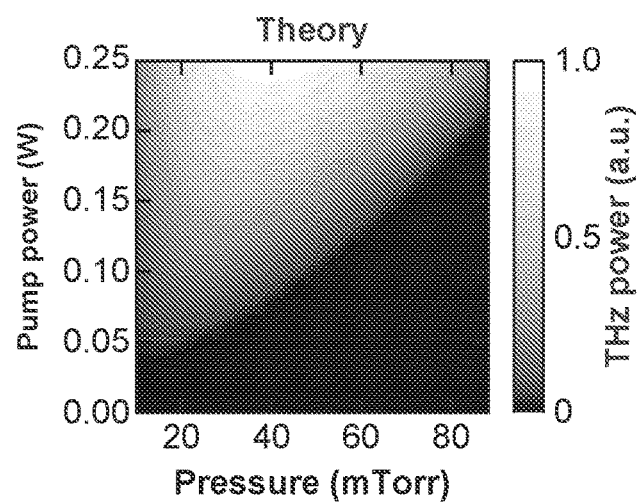
Figure 2D:
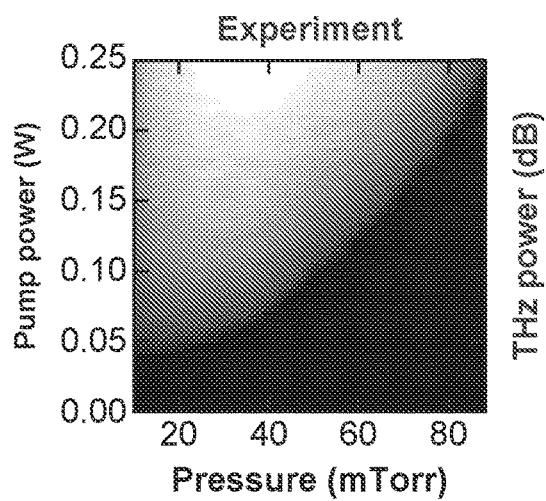
Figure 2E:
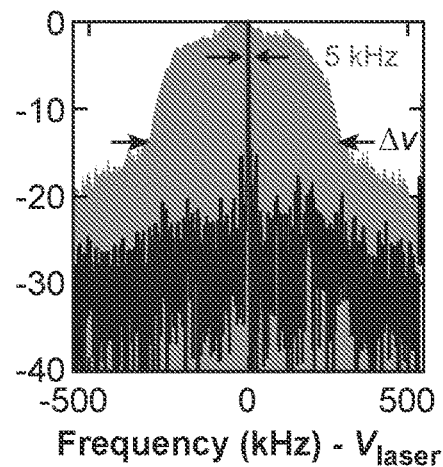

FIG. 2B shows the output power of the QPML plotted as a function of the IR pump power from the QCL: after accounting for losses in the collected IR and THz powers, the threshold is $P_{th}=70$ mW, the maximum power is ~0.04 mW, and $\eta=0.2$ mW/W at 40 mTorr for the $J_U=15 \rightarrow 14$ transition at 0.374 THz. FIG. 2C shows predicted results, and FIG. 2D shows measured results, the results including QPML laser power as a function of gas pressure and QCL pump power for the same direct transition. FIG. 2E shows an emission spectrum of the laser (lower profile) showing a linewidth of ≤5 kHz at 0.374 THz, corresponding to the $J_U=15 \rightarrow 14$ transition. The full tuning range of the given QPML transition (upper profile) is achieved by varying the cavity length.

For a given QCL pump power, the terahertz power achievable by this room temperature laser depends on several factors. To ascertain the potential of a given molecular gas as a QPML, consider the very low-pressure regime for which molecular collisions with the chamber walls occur more frequently than any inter-molecular collisions. In the typical regime, where the ~1 MHz QCL linewidth (27) is much less than the ~50-150 MHz Doppler width of the IR molecular transition, a simple expression (derived in the Supplementary Information (SI) provided below) gives the QPML laser power $$P_{THz} = \frac{T}{4}\left(\frac{v_{THz}}{v_{IR}}\right)\left(\frac{\alpha_{IR}}{\alpha_{cell}}\right)[P_{QCL} - P_{th}] = \eta[P_{QCL} - P_{th}] \quad (1)$$

at frequency $v_{THz}$ and identifies the parameters on which the laser power depends. Here, $\alpha_{IR}$ is the IR absorption coefficient of the gas molecule at the frequency $v_{IR}$ to which the QCL is tuned, $\alpha_{cell}$ captures the losses of the cavity, $P_{QCL}$ is the QCL pumping power and T is the front window transmission coefficient for the THz output. For a pinhole coupler with $v_{THz} > c/2r_0$, $T \approx (r_0/R_{cell})^2$ where $R_{cell}$ is the cavity radius and $r_0$ is the radius of the output coupler. But if the lasing frequency is low, T depends sensitively on the pinhole thickness. Combined, the factors before the square bracket in Eq. 1 constitute the power efficiency $\eta$ of the QPML. The lasing threshold $$P_{th} = \frac{h^2}{4\pi} \frac{v_{IR}}{\alpha_{IR}}(\alpha_{cell} R_{cell}) \frac{u^2}{|\langle J_U - 1|\mu|J_U\rangle|^2} \quad (2)$$

depends on many of the same parameters, as well as the absolute molecular velocity u and the transition dipole matrix element of the rotational transition $\langle J_U-1|\mu|J_U\rangle$. As expected, the threshold increases with increasing cavity loss, but the dependence of $P_{th}$ on cell radius is more subtle because of the strong increase of $\alpha_{cell}$ with decreasing $R_{cell}$ due to ohmic loss experienced by the modes of the hollow metal cavity. The threshold decreases for increasing dipole moment and decreasing $v_{IR}$, indicating that terahertz lasing is favored for strongly polar molecules with low frequency vibrational modes.

Importantly, Eq. 1 shows that the maximum power achievable by the QPML, often known as the Manley-Rowe limit, is determined by the ratio of the terahertz laser and IR pump frequencies $v_{THz}/v_{IR}$. Any vibrational band may be pumped by the QCL, but this Manley-Rowe limit also recommends low frequency vibrational modes pumped by long-wavelength QCLs. If powerful QCLs are available at higher frequencies, the selection of which vibrational mode to excite must be determined by its absorption strength, the Manley-Rowe factor, and the available QCL power.

Moreover, the Manley-Rowe factor indicates that the maximum power of the QPML grows with increasing laser frequency for a given QCL and vibrational band, in great contrast with electronic sources. This Manley-Rowe effect is tempered by the pressure-dependent population $n_{JL}$, manifested in the IR absorption term $\alpha_{IR}$, available for the QCL to excite. One may simply look at the IR spectrum of a molecule to estimate how the power of the corresponding terahertz laser can depend on A. However, the predicted power (Eq. 1) is proportional to the product of $\alpha_{IR}$ and $v_{THz}/v_{IR}$, and FIG. 1B confirms that the peak power occurs when the QCL pumps a transition with higher $J_L$ than the peak of the IR band (where $n_{JL}$ is maximum) because of the Manley-Rowe effect.

The simple model of Eqs. 1-2 captures the molecular and cavity parameters for ascertaining how a given molecular gas can perform as a QCL-pumped terahertz laser. Table 1 summarizes these behaviors for eight candidate polar molecules, sorted by threshold pump power. Although the oblate symmetric top $NH_3$ has recently been reported as a low threshold QPML near 1 THz, and the simple model reveals higher power efficiency and larger output power at even higher frequencies, and reveals that $CH_3F$ and OCS have even lower thresholds. The high $v_{THz}$ of $NH_3$, coupled with its low $v_{IR}$ and the high $\alpha_{IR}$, combine to produce high power efficiency and large output power. However, the linear (OCS, HCN, $N_2O$, CO) and prolate ($CH_3F$, $H_2CO$, $CH_3^{35}Cl$) molecules offer much greater tunability, in both range and spacing, throughout the terahertz spectral region.

TABLE 1

Predicted QPML power (Eq. 1) and QCL threshold pump power (Eq. 2) for the strongest lasing transitions of nine candidate laser molecules. Assumes a 0.25 W QCL pumping through a 1 mm diameter pinhole output coupler into a 5 mm diameter cylindrical laser cavity ($\alpha_{cell} = 0.06$ m$^{-1}$, T = 0.016) containing 20 mTorr of the molecular gas.

| Molecule | $J_L$ (peak) | $v_{THz}$ (THz) | $P_{THz}$ (mW) | $P_{th}$ (mW) | $\eta$ (mW/W) | $\mu$ (D) | $v_{IR}$ (cm$^{-1}$) | $\alpha_{IR}$ (m$^{-1}$) |
|---|---|---|---|---|---|---|---|---|
| $CH_3F$ | 17 | 0.907 | 1.40 | 0.063 | 5.60 | 1.85 | 1075.379 | 3.96 |
| $NH_3$ | 3 | 1.073 | 3.3 | 0.109 | 13.2 | 1.46 | 967.346 | 10.9 |
| HCN | 11 | 1.064 | 0.29 | 0.178 | 1.14 | 2.98 | 1447.962 | 0.74 |
| $H_2CO$ | 12 | 0.970 | 0.28 | 0.229 | 1.12 | 2.33 | 1776.936 | 0.99 |
| OCS | 43 | 0.535 | 0.77 | 0.251 | 3.10 | 0.72 | 2077.629 | 11.1 |

TABLE 1-continued

Predicted QPML power (Eq. 1) and QCL threshold pump power (Eq. 2) for the strongest lasing transitions of nine candidate laser molecules. Assumes a 0.25 W QCL pumping through a 1 mm diameter pinhole output coupler into a 5 mm diameter cylindrical laser cavity ($\alpha_{cell} = 0.06$ m$^{-1}$, T = 0.016) containing 20 mTorr of the molecular gas.

| Molecule | $J_L$ (peak) | $v_{THz}$ (THz) | $P_{THz}$ (mW) | $P_{th}$ (mW) | $\eta$ (mW/W) | $\mu$ (D) | $v_{IR}$ (cm$^{-1}$) | $\alpha_{IR}$ (m$^{-1}$) |
|---|---|---|---|---|---|---|---|---|
| CH$_3$$^{35}$Cl | 21 | 0.585 | 0.015 | 2.43 | 0.06 | 1.90 | 1459.576 | 0.068 |
| CH$_3$OH | 15 | 2.523 | 0.090 | 4.90 | 0.37 | 1.41 | 1031.477 | 0.068 |
| N$_2$O | 27 | 0.703 | 0.83 | 8.08 | 3.43 | 0.17 | 2244.404 | 8.92 |
| CO | 10 | 1.268 | 0.88 | 41.2 | 4.19 | 0.12 | 2183.224 | 4.45 |

Because the simple, three-level model in Eqs. 1-2 may only be valid at very low pressures, there is no collisional quenching of the laser inversion, and $P_{THz}$ is predicted to increase linearly with increasing pressure (through $\alpha_{IR}$). Of course, this best-case approximation fails at higher pressures when inter-molecular dipole-dipole, rotational-state randomizing, and velocity-randomizing collisions dominate the laser performance and quench the inversion in a manner that depends on collision cross sections that may not be known. The present disclosure provides a model that captures these behaviors to predict the performance of QPMLs as a function of $P_{QCL}$, and pressure.

To illustrate the performance and tunability of a compact QPML, consider nitrous oxide (N$_2$O), whose $v_3$ vibrational mode falls within the 2119-2342 cm$^{-1}$ tuning range of a 320 mW QCL (Daylight Solutions 41045-HHG). The spacings of the N$_2$O lasing transitions are $\sim 2B_{N_2O} = 25.1$ GHz, and the frequency span over which this QPML may be tuned is $\sim 1.5$ THz. Frequency tuning was accomplished by monitoring the QCL signal transmitted through a 15 cm gas cell containing 50 mTorr of N$_2$O using a HgCdTe detector (Vigo PV-106). The QCL frequency was tuned by precise temperature control until molecular absorption minimized the transmitted IR power (FIG. 2A). Herein, lasing transitions (both direct and refilling) are referred to by the quantum number $J_L$ of the lower level drained by the infrared pump, assuming an R-branch transition. For example, the $J_L=14$ direct transition refers to the rotational transition $J_U=15 \rightarrow 14$ in the excited vibrational state of the molecule.

Figure 3A:
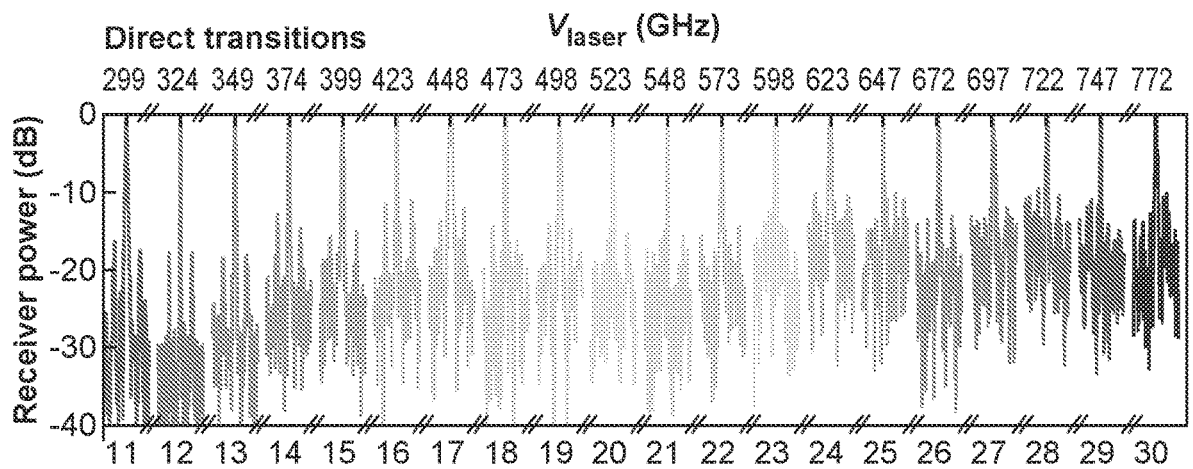
FIGS. 3A and 3B illustrates emission spectra of a laser and lasing transitions, according to an example embodiment.
Figure 3B:
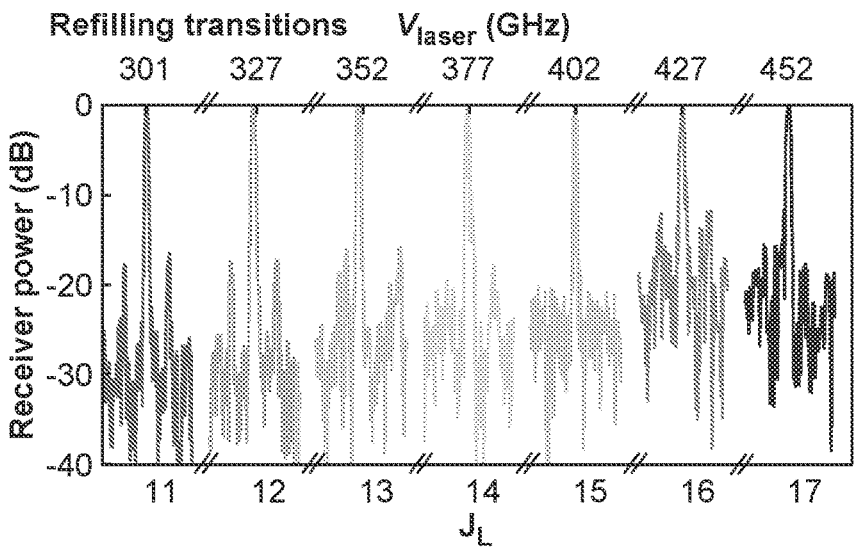
Figure 3C:
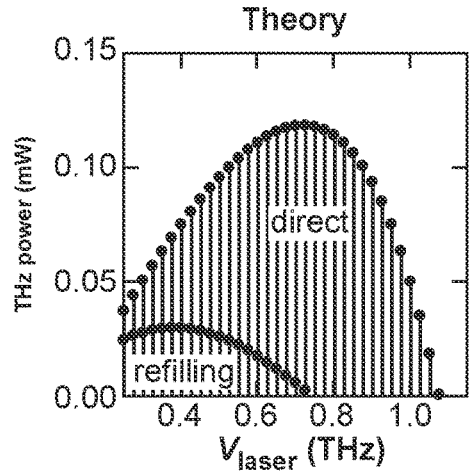
FIG. 3C illustrates predicted THz output power, according to an example embodiment.

FIGS. 3A and 3B show emission spectra of the laser that were measured as the QCL pump laser was tuned to different infrared transitions of N$_2$O. The top x-axis shows the measured emission frequency while the bottom x-axis shows the quantum number of the lower state of the pumped R-branch transition. The QCL power was maximal (up to 0.25 W coupled in the cavity), and the pressure was 40 mTorr for direct transitions and 20 mTorr for refilling transitions. FIG. 3A shows measured spectra of direct transitions with $J_L$ from 11 to 30. FIG. 3B shows measured spectra of refilling transitions with $J_L$ from 11 to 17. FIG. 3C shows the output power of the laser predicted by the model using the deduced collisional parameters of N$_2$O and the estimated cavity losses, plotted as a function of frequency for the optimal pressure.

Lasing was observed for all 31 direct lasing transitions (FIG. 3A) and 8 refilling transitions (FIG. 3B) between 0.251-0.995 THz (corresponding to $9 \leq J_L \leq 39$) by exciting each R-branch $v_3$ rotational vibrational transition over a QCL tuning range of 2231-2253 cm$^{-1}$. Refilling transitions and direct transitions corresponding to the same Ji exhibit slightly different frequencies due to different B rotational constants for the ground and excited states. Lower-frequency lasing could not be observed because it occurred below the radiation-suppressing cutoff frequency of the pinhole output coupler. For most transitions, the strength of the laser emission is measured as a function of pressure for maximum QCL pumping power, and in some cases the laser emission is also measured as a function of QCL pumping power (see FIG. 2B for $J_L=14$). From these measurements, the threshold power $P_{th}$ and power efficiency $\eta$ of many laser lines is obtained (see Supplemental Materials), providing critical information for ascertaining the molecular dipole-dipole and thermalizing gas kinetic collisional cross sections that may be needed in the comprehensive model.

Heterodyne receivers operating between 0.300 and 0.775 THz were also used to measure the spectrum of these laser transitions (see FIG. 2E for the recovered line at $v_{THz}=0.374$ THz). The instantaneous linewidths were less than 1 kHz, but because of frequency jitter the effective linewidths were typically 3-6 kHz. Other measured lines are shown in FIGS. 3A-3B over a 200 kHz span. Frequency tuning of the laser across its full Doppler-broadened gain bandwidth was demonstrated by precisely adjusting the cavity length with a motorized micrometer, as shown by the broad feature (upper profile) in FIG. 2E. This is the envelope of all the individual frequencies the laser was tuned to while keeping the pump laser at a constant power and frequency. Importantly, the QPML frequency was quite stable (routinely <10 kHz) while freely running and could be made even more stable through active frequency stabilization of the QCL and the laser cavity.

Using these experimental measurements, a comprehensive theoretical model was able to constrain the collisional cross sections and predict the optimal performance of the laser. FIGS. 2C-2D respectively reveal the excellent agreement between the theoretical and measured output THz power for $J_L=14$ as a function of N$_2$O pressure and QCL pump power. The fit estimated the dipole-dipole collisional cross-section to be 35 Å$^2$, well within the expected range, and the THz cavity loss was fit to 0.3 m$^{-1}$, five times higher than the theoretical minimum (see SI). The model predicts, and measurements confirm, that the optimal and maximum pressure for laser operation increases with increasing $J_L$ (see SI), a consequence of the increasing Doppler width of the gain profile with increasing laser frequency. The model was used to predict the expected laser power for each transition at its optimal gas pressure, and FIG. 3C shows that the direct lasing transition with maximum power occurs not for $J_L=15$, where $n_{JL}$, is largest, but for $J_L=28$ because of the Manley-Rowe effect. While the output power increased as a function of the frequency, the signal-to-noise ratio in the heterodyne measurement (FIGS. 3A-3B) was limited by the decreasing efficiency of the electronic sub-THz source on which this measurement is based. An emitted power of 0.069 mW was predicted for the $J_L=14$, $v_{THz}=0.374$ THz transition in a perfectly aligned single mode cavity. Although only 0.010 mW was measured, the power measurements can underestimate the emitted power by at least a factor of four for several reasons, including imperfect cavity alignment, competition among several cavity modes above the lasing threshold, severe diffraction and low transmission of the terahertz beam emitted through the 1 mm diameter output coupler, absorption and reflection by the ZnSe Brewster window and Teflon lens, and use of the power meter at the edge of its calibrated range.

The theoretical models and experimental demonstrations of wide terahertz tunability by QCL pumping of $N_2O$ illustrate the universal concept of broadly tunable molecular lasers as a promising compact terahertz source. Indeed, the future is extremely promising for these bright OPFIR lasers (defined by their brightness temperatures $T_b = Ic^2/2 kv_{THz}^2 \Delta v) > 10^{14}$K for laser radiance I=1 mW·cm$^{-2}$·sr$^{-1}$, where k is the Boltzman constant, c the speed of light and a linewidth $\Delta v$=1 kHz), especially as more powerful single-modefrequency stabilized QCLs are being developed at longer wavelengths. To improve portability, vacuum systems may be eliminated by placing within the confocal cavity a sealed waveguide containing a given laser gas at its optimal pressure. In addition to "coarse" line-by-line tuning of the QPML, "fine" tuning for a given line may be accomplished through Stark tuning techniques, which may also be useful for frequency modulating the QPML as a local oscillator for spectroscopy, radar, or astronomical sensing. The tunable QCL pump may soon be replaced with an even smaller footprint multi-wavelength array of single mode distributed feedback QCLs so that terahertz tuning can be achieved by sequentially driving different lasers. Additionally, a tailored meta-surface could replace the pinhole output coupler to optimize the competing requirements for low loss IR pumping and high terahertz reflectivity (98%) for optimal laser power while generating the desired spatial mode and minimizing mode competition.

In a first aspect of the present disclosure, a laser system includes a first laser and a second laser. The first laser includes: a laser cavity; and a gas phase molecular gain medium disposed in the laser cavity, the gain medium having an absorption band. The second laser is a solid state laser whose emission wavelength may be continuously tuned over the absorption band of the gain medium; and the second laser is tuned to pump P-, Q-, or R-branch rotational vibrational transitions in the gain medium to achieve a rotational population inversion. Thus, for example, the laser system may be tuned to emit light on any rotational transition line of the gain medium and over a wide range of wavelengths (e.g., compared to a laser system where the second laser is a gas laser, and such a laser system relies on rare coincidence of gas pumping laser emission lines and rotational vibrational transition lines of the molecular gain medium). Throughout, the term "molecule" refers not just to the most naturally abundant molecular species (for example, the term can encompass all isotopic isomers). Likewise, "rotational transition" do not refer only to purely rotational transitions (for example, the term can also refer to transitions in which rotational motion is coupled to other molecular motions such as electronic (e.g., Hund's coupling cases and A-type doubling transitions), vibrational (e.g., 1-doubled transitions), torsional, inversional (e.g., pure inversion or rotation-inversion transitions), or nuclear (e.g., hyperfine transitions)).

In some embodiments according to the first aspect, the first laser cavity can comprise a tunable resonant cavity of any appropriate cross section (e.g., cylindrical or rectangular), a first mirror that is a partially reflective mirror, and a second mirror that is a tunable mirror to adjust a cavity resonance frequency.

In some embodiments according to the first aspect, the resonant cavity can be a cavity composed of a metal or dielectric material.

In some embodiments according to the first aspect, the partially reflective mirror can include a metallic or dielectric mirror with a pinhole.

In some embodiments according to the first aspect, the partially reflective mirror can include a metasurface (e.g., a surface comprising nanostructures) or other patterned structure.

In some embodiments according to the first aspect, the resonant cavity resonance frequency can be tuned by adjusting the length of the resonant cavity (e.g., by changing temperature of the metal to expand/contract, by stretching the cavity, by integrating piezoelectric material inside the cavity to change its length by applying an electric voltage, or by any other appropriate means).

In some embodiments according to the first aspect, the resonance frequency of the resonant cavity can be tuned by adjusting the length of the resonant cavity by adjusting the position of the second mirror.

In some embodiments according to the first aspect, the first laser cavity comprises a photonic crystal resonant cavity.

In some embodiments according to the first aspect, the absorption band comprises an entire span of a P-, Q-, or R-branch vibrational-rotational spectrum of the gain medium. Thus, for example, the laser system may be configured to selectively provide light having a wide range of possible wavelengths using a single gain medium.

In some embodiments according to the first aspect, the second laser is configured to be continuously tunable. Thus, for example, the laser system may be tuned more finely (e.g., using smaller step sizes) and cover a broader spectral range than certain comparative systems.

In some embodiments according to the first aspect, the gain medium can be but is not restricted to molecules that: have a permanent electric dipole moment, a non-zero vapor pressure, and an IR absorption band that can be spanned by the second laser. Thus, for example, the laser system may make use of a variety of gain mediums and their respective rotational vibrational absorption spectrum absorption bands to provide lasing over a wide range of wavelengths.

In some embodiments according to the first aspect, the gain medium can be but is not restricted to $N_2O$, OCS, HCN, $NH_3$, $CH_3F$, $CH_3Cl$, $CH_3OH$, or CO or any of their isotopic isomers. Thus, for example, the laser system may make use of a variety of gain mediums and their respective rotational vibrational spectrum to provide lasing at a wide range of wavelengths.

In some embodiments according to the first aspect, the gain medium can be a mixture of gases at various concentrations. Thus, for example, the laser system may make use of each gas in the gain medium gas mixture and their respective rotational vibrational spectrum absorption bands to provide lasing at light having a wide range of wavelengths.

In some embodiments according to the first aspect, the gain medium can be a mixture of gases at various concentrations. Thus, for example, the laser system may utilize gas mixtures to alter the relaxation of the molecules.

In some embodiments according to the first aspect, the gain medium can be $NH_3$, and the second laser is a solid state laser configured to be continuously tunable over the absorption band of the gain medium; and the second laser is tuned to pump rotational vibrational transitions in the gain medium to achieve a population inversion corresponding to pure inversion or rotation-inversion transitions. In this case, the laser system may be tuned to emit light below 700 GHz or above 1200 GHz.

In some embodiments according to the first aspect, the solid state laser is a semiconductor laser or a fiber laser. Thus, for example, the laser system can implement various types of lasers as the second laser.

In some embodiments according to the first aspect, the solid state laser can be of fixed wavelength, where the wavelength matches the energy to excite a P-, Q-, or R-branch rotational vibration transition of the gas phase molecular gain medium.

In some embodiments according to the first aspect, the solid state laser can be a continuously tunable laser, and may be tuned over a wavelength range, to match at least one energy used to excite a P-, Q-, or R-branch rotational vibration transition of the gas phase molecular gain medium.

In some embodiments according to the first aspect, the solid state laser can be a continuously tunable laser, and may be tuned over a wavelength range, to match a plurality of energy levels to excite different rotational vibration transitions of the gas phase molecular gain medium.

In some embodiments according to the first aspect, the solid state laser is a quantum cascade laser. Thus, for example, the laser system can implement various lasers types as the second laser.

In some embodiments according to the first aspect, the solid state laser is an interband cascade laser, or a III-V semiconductor laser. Thus, for example, the laser system can implement various lasers types of as the second laser.

In some embodiments according to the first aspect, the laser system is configured to selectively emit light of different wavelengths by tuning the second laser. Thus, for example, the laser system can provide for selectively emitting light of different wavelengths without having to replace the gain medium of the first laser.

In some embodiments according to the first aspect, the laser system is configured to selectively emit light of different wavelengths without changing the gain medium and without tuning the second laser. Thus, for example, a single gain medium pumped by a fixed wavelength of the second laser may be used to selectively provide light having a wide variety of wavelengths. For example, rotational population inversions can be created in the excited vibrational state or in the ground vibrational state (FIG. 1A). In various embodiments, the ground vibrational state refers to the lowest energy level of a molecule. In various embodiments, an absorption line refers to a transition between vibrational levels (e.g., energy levels, etc.). In various embodiments, an absorption band refers to a set of absorption lines, such as those in a frequency range, etc.

In a second aspect of the present disclosure, a method of using a laser system includes: providing a first laser comprising a laser cavity and a gas phase molecular gain medium disposed in the laser cavity, the gain medium having an absorption band; tuning a second laser over the absorption band to pump P-, Q-, or R-branch rotational vibrational transitions in the gain medium, the second laser being a solid state laser; and pumping the rotational vibrational transitions in the gain medium of the first laser using the second laser to achieve a rotational population inversion in the gain medium. Thus, for example, the laser system may be tuned to emit light on any rotational transition lines if the gain medium and over a wide range of wavelengths (e.g., compared to a laser system where the second laser is a gas laser, and such a laser system relies on rare coincidence of gas pumping laser emission lines and rotational vibrational transition lines of the molecular gain medium).

In some embodiments according to the second aspect, the first laser cavity can comprise a tunable resonant cavity of any cross section (e.g., cylindrical or rectangular), a first mirror that is a partially reflective mirror, and a second mirror that is a tunable mirror to adjust a cavity resonance frequency.

In some embodiments according to the second aspect, the resonant cavity can be a cavity composed of a metal or dielectric material.

In some embodiments according to the second aspect, the partially reflective mirror can include a metallic or dielectric mirror with a pinhole.

In some embodiments according to the second aspect, the partially reflective mirror can include a metasurface (e.g., a surface comprising nanostructures) or other patterned structure.

In some embodiments according to the second aspect, the resonant cavity resonance frequency can be tuned by adjusting the length of the resonant cavity (e.g., by changing temperature of the metal to expand/contract, by stretching the cavity, by integrating piezoelectric material inside the cavity to change its length by applying an electric voltage, or by any other appropriate means).

In some embodiments according to the second aspect, the resonance frequency of the resonant cavity can be tuned by adjusting the length of the resonant cavity by adjusting the position of the second mirror.

In some embodiments according to the second aspect, the first laser cavity comprises a photonic crystal resonant cavity.

In some embodiments according to the second aspect, the absorption band comprises an entire span of a P-, Q-, or R-branch vibrational-rotational spectrum of the gain medium. Thus, for example, the laser system may be used to selectively provide light having a wide range of possible wavelengths using a single gain medium.

In some embodiments according to the second aspect, the second laser is configured to be continuously tunable. Thus, for example, the laser system may be tuned more finely (e.g., using smaller step sizes) and cover a broader spectral range than certain comparative systems. As a non-limiting example, this may be in contrast to a laser in which a second laser is not continuously tunable (e.g., specific CO2 gas lasers, etc.).

In some embodiments according to the second aspect, the gain medium can be but is not restricted to molecules that: have a permanent electric dipole moment, and a non-zero vapor pressure, and an IR absorption band that can be spanned by the second laser. Thus, for example, the laser system may make use of a variety of gain mediums and their respective rotational vibrational spectrum absorption bands to provide lasing over a wide range of wavelengths.

In some embodiments according to the second aspect, the gain medium can be but is not restricted to $N_2O$, OCS, HCN, $NH_3$, $CH_3F$, $CH_3Cl$, $CH_3OH$, or CO or any of their isotopic isomers. Thus, for example, the laser system may make use of a variety of gain mediums and their respective rotational vibrational spectrum to provide lasing at a wide range of wavelengths.

In some embodiments according to the second aspect, the gain medium can be a mixture of gases at various concentrations. Thus, for example, the laser system may make use of each gas in the gain medium gas mixture and their respective rotational vibrational spectrum absorption bands to provide lasing at light having a wide range of wavelengths.

In some embodiments according to the second aspect, the gain medium can be a mixture of gases at various concentrations. Thus, for example, the laser system may utilize gas mixtures to alter the relaxation of the molecules.

In some embodiments according to the second aspect, the gain medium can be $NH_3$, and the second laser is a solid state laser configured to be continuously tunable over the absorption band of the gain medium; and the second laser is tuned to pump rotational vibrational transitions in the gain medium to achieve a population inversion corresponding to pure inversion or rotation-inversion transitions. In this case the laser system may be tuned to emit light below 700 GHz or above 1200 GHz.

In some embodiments according to the second aspect, the solid state laser is a semiconductor laser or a fiber laser. Thus, for example, the laser system can implement various types of lasers as the second laser.

In some embodiments according to the second aspect, the solid state laser can be of fixed wavelength, where the wavelength matches the energy to excite a P-, Q-, or R-branch rotational vibration transition of the gas phase molecular gain medium.

In some embodiments according to the second aspect, the solid state laser can be a continuously tunable laser, and may be tuned over a wavelength range, to match at least one energy used to excite a P-, Q-, or R-branch rotational vibration transition of the gas phase molecular gain medium. In various embodiments, continuously tunable lasers may facilitate continuous tuning of an emission frequency.

In some embodiments according to the second aspect, the solid state laser can be a continuously tunable laser, and may be tuned over a wavelength range, to match a plurality of energy levels to excite different rotational vibration transitions of the gas phase molecular gain medium.

In some embodiments according to the second aspect, the solid state laser is a quantum cascade laser. Thus, for example, the laser system can implement various lasers types as the second laser.

In some embodiments according to the second aspect, the solid state laser is an interband cascade laser, or a III-V semiconductor laser. Thus, for example, the laser system can implement various lasers types of as the second laser.

In some embodiments according to the second aspect, the laser system is configured to selectively emit light of different wavelengths by tuning the second laser. Thus, for example, the laser system can provide for selectively emitting light of different wavelengths without having to replace the gain medium of the first laser. In various embodiments, this is made possible by the continuous frequency tunability of the second laser. Broadly tunable lasers such as continuously tunable lasers are described in greater detail with reference to U.S. patent application Ser. No. 11/611,819, filed on Dec. 15, 2006, the entirety of which is incorporated by reference herein.

In some embodiments according to the second aspect, the laser system is configured to selectively emit light of different wavelengths without changing the gain medium and without tuning the second laser. Thus, for example, a single gain medium pumped by a fixed wavelength of the second laser may be used to selectively provide light having a wide variety of wavelengths. For example, rotational population inversions can be created in the excited vibrational state or in the ground vibrational state (FIG. 1A).

Some additional embodiments of the present disclosure provide for Stark tuning. Degeneracies of rotational states can be split by applying an external electric field. Energetic splitting of these degeneracy levels depends on the strength of the applied electric field. This energetic splitting is also dependent on the rotational energy level (labeled by quantum numbers J and M). The transition within the rotational states is allowed only for the delta M (change in quantum number of degeneracy state)=0, ±1. Thus the energy difference between rotational states at which rotational relaxation occurs can be controlled by adjusting a magnitude of an applied electric field. This allows for a broad tuning of each lasing line.

Some additional embodiments of the present disclosure provide for Zeeman tuning. Degeneracies of rotational states can be split by applying an external magnetic field. Energetic splitting of these degeneracy levels depends on the strength of the applied magnetic field. This energetic splitting is also dependent on the rotational energy level (labeled by quantum numbers J and M). The transition within the rotational states is allowed only for the delta M (change in quantum number of degeneracy state)=0, ±1. Thus the energy difference between rotational states at which rotational relaxation occurs can be controlled by adjusting a magnitude of an applied magnetic field. This allows for a broad tuning of each lasing line.

Some additional embodiments of the present disclosure provide for signal amplification. The population inversion of rotation states can be exploited to amplify the signal that lies within the molecular gain bandwidth of the given rotational population inversion frequency. The externally applied signal stimulates the rotational relaxation, which increases the power output at this frequency. The noise of the amplifier depends on the rate of radiative or non-radiative relaxation, which in the case of the molecular laser directly depends on the rate of dipole-dipole interaction between the molecules. The amplification power depends on the rate of stimulated emission, on the population inversion rate and on the total number of molecules in the excited state. Stimulated emission rate depends on the dipole moment of the molecule (the larger the dipole moment, the larger the rate of stimulated emission) and on the intensity of the signal to be amplified. The population inversion rate depends on the pump power intensity and other factors such as pressure, temperature, and cavity size. The total number of molecules in the excited state depends on the volume of the cavity, pressure and temperature of the gas, the population of the lower rotational level in the ground vibration state (according to the combination of degeneracy and Boltzmann distribution), IR pump power (of the second laser), and possibly other factors.

Some additional embodiments of the present disclosure provide for other implementations. Many variations are possible in the input (pump laser) and output (THz) couplers and/or in the cavity design. The input could be changed to lie on one end of the cavity or on the other end of the cavity (e.g., an end at which a movable plunger is provided). Either the input or the output could employ a partially reflecting mirror instead of a pinhole, either made of a solid material or a composite of different materials, including "metamaterial" composites consisting of many subwavelength elements designed to transmit/reflect in a specified way. For example, the output coupler could be a metal plate with an array of holes smaller than the output wavelength, designed to collectively transmit a particular pattern. The output coupler could also be an aperiodic "metasurface" or Fresnel lens or diffraction grating designed to reshape the output light into a particular beam pattern. The THz output could also be coupled into a mode converter—for example, if the THz lasing mode is TE01, a technique may involve using a circularly bent waveguide designed to convert TE01 into a linearly polarized mode such as TM11, which can then be shaped into a Gaussian beam. The cavity could be rectangular instead of cylindrical, or have another shape in order to favor lasing by a particular mode. Modal filters, such as helical wire tubes or other solenoid-like shapes, could be used to suppress unwanted modes (e.g., modes other than TE01) from lasing, similar to modal filters designed for this purpose in microwave transmission. The inner surface of the metal could be coated with one or more layers of low-loss dielectric materials in order to suppress Ohmic loss from the cavity walls. The movable plunger could be a variety of shapes, including flat, concave, and convex plungers. Cavity tuning could also be accomplished by other deformations, for example squeezing the sidewalls if the metallic walls are thin coatings on a flexible material; dielectric materials could also be introduced into the cavity, e.g., a movable dielectric plug instead of a movable mirror. The rear mirror could be omitted by simply tapering the cavity towards one end until its diameter shrinks below the cutoff for THz waveguiding—this would allow an open end to be used for injecting the pump input, while tuning could be accomplished by moving the output surface or by one of the other mechanisms mentioned above. A waveguide taper could also be used for the output coupler: by tapering to narrower than cutoff and then tapering back to a larger diameter, any desired partial transmission ("tunneling" through the narrowed cutoff region via evanescent fields) could be designed by choosing an appropriate length of the narrowed region. Multiple input beams could also be used, in order to pump the cavity interior more powerfully or uniformly and/or to excite multiple transitions or otherwise alter the populations of different energy levels. Low-loss dielectric materials could also be incorporated into the cavity, e.g., dielectric rods or particles or a micro-porous foam-like material, in order to increase the surface area for molecule-wall collisions, and also to provide another avenue for tunability (e.g., by moving the dielectric materials or compressing the foam). Neutral gases could also be injected into the cavity, in addition to the gas used for lasing, in order to modify the collision processes. The gas temperature could also be controlled, e.g., by cooling the gas significantly one could have more molecules at the same pressure and reduce Doppler broadening.

Some additional embodiments of the present disclosure provide for a laser system can be used as an oscillator source to produce signal at a wide range of frequencies. Such an oscillator source can be used (for example):

- as a local oscillator for spectroscopic measurements;
- as a local oscillator for spectroscopic measurements in radio-astronomy;
- as a signal source for radar;
- as a signal source for imaging;
- as a signal source or local oscillator for communications;
- as a signal source for transmission spectroscopic measurements; or
- as a signal source for reflection spectroscopic measurements.

Such a laser system can be used as an amplifier, such as, for example:

- a low-noise signal amplifier;
- a low noise amplifier for radio-astronomy;
- a low noise amplifier for communication;
- a low noise amplifier for reflection spectroscopic measurements;
- a low noise amplifier for radar;
- a low noise amplifier for imaging;
- a power amplifier;
- a power amplifier for transmission spectroscopic measurements;
- a power amplifier for reflection spectroscopic measurements;
- a power amplifier for imaging; or
- a power amplifier for radar.

SUPPLEMENTAL MATERIAL

I. Materials and Methods

A. Tuning the QCL Emission into the Gas Absorption Line

External-Cavity (EC)-QCLs rely on a diffraction grating mounted on a precisely controlled actuator (piezo-electric, stepper-motor, voice-coil actuator). The laser device used in the experiments described herein (Daylight Solutions HHG 41045), is factory calibrated for grating tuning of the emission, but this tuning is discrete and typically has a resolution of 0.1 cm'. According to the manufacturer specifications, the target emission wavenumber and the actual emission wavenumber may differ by up to 1 cm'. Once the grating is tuned to a desired position, continuous tuning can occur by changing the temperature of the laser. For the experiments described herein, tuning into an absorption line was performed as follows: a line is selected and the grating of the EC-QCL is tuned close to the HITRAN value for the transition, then the QCL temperature is cycled between 17° C. and 22° C. while the transmitted intensity through the gas cell is monitored by a Vigo PV-106 HgCdTe detector. If during this cycling of the temperature a strong absorption feature was observed, the QCL temperature was set in order to minimize the transmitted intensity. The emission wavenumber of the QCL was then measured on the FTIR and compared with HITRAN data to confirm that the targeted transition was effectively selected. If during the cycling of the QCL temperature, no absorption feature was seen, then the grating was tuned slightly differently by increments of 0.1 $cm^{-1}$ until an absorption feature was observed.

B. Controlling the Pressure Inside the THz Laser Cavity

Figure 4A:
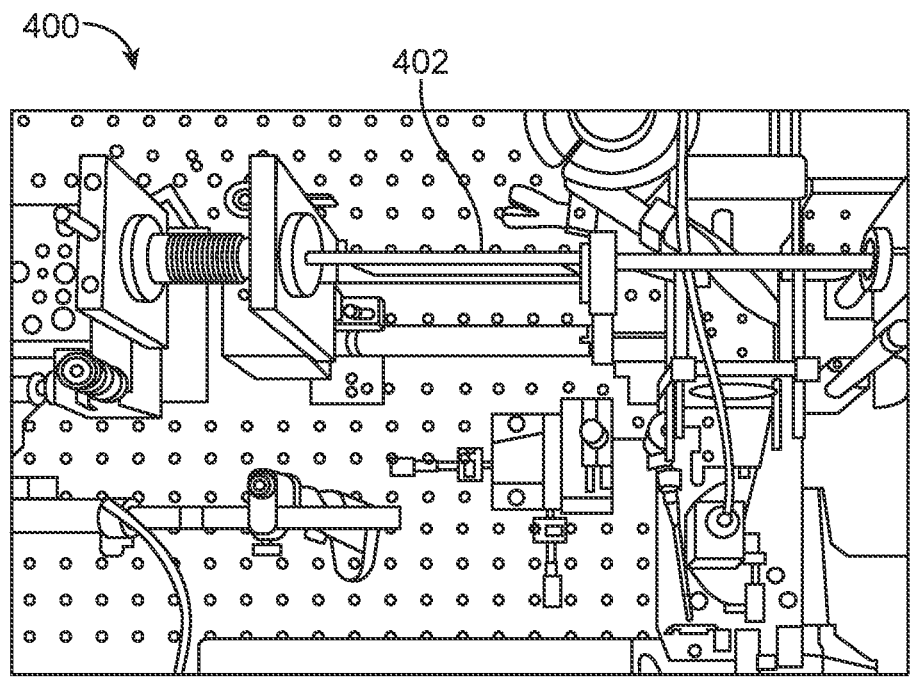
FIG. 4A is a photograph of an experimental setup, according to an example embodiment.
Figure 4B:
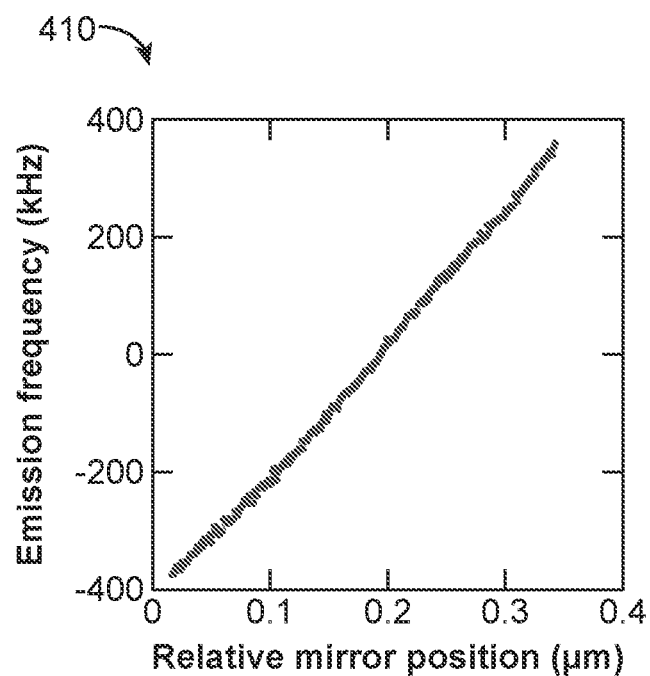
FIG. 4B illustrates a single emission frequency and a corresponding tuning range, according to an example embodiment.

FIG. 4A is a photograph 400 of the experimental setup showing the different components of the laser cavity, the path of the QCL beam 402 (from left to right), and how the output light is collected. FIG. 4B is a plot of the measured relative emission frequency of the THz gas laser as a function of the back-mirror position for $J_L$=10, ($v_{THz}$≈0.299 THz). The operating pressure range of the laser (FIG. 4A) lies between 10 mTorr and 100 mTorr (or 1.3 Pa to 13 Pa). To measure such low pressure levels in the cavity a Pirani pressure gauge (Alcatel sensor AP1004 and controller ACR1000) was used which has a resolution of $10^{-5}$ Torr and an accuracy of $10^{-3}$ Torr. To fill the cavity with a specific amount of gas, first a high vacuum (pressure below $10^{-5}$ Torr) is achieved in the cavity by using a Varian DS402 rough pump and a Varian V-70LP Turbo pump. A sample tube connected to the vacuum manifold with a valve and containing a few milliliters of pure nitrous oxide at atmospheric pressure is cooled down by a bath of liquid nitrogen (see schematic in FIG. 2A of the manuscript). Once high vacuum is reached in the cavity, nitrous oxide is introduced in the cavity by closing the vacuum pump valve, opening the valve of the sample tube and warming the tube and its contents. Since the liquid nitrogen bath has initially completely solidified the nitrous oxide in the tube, the sublimation of nitrous oxide can progressively increase the pressure in the cavity. The valve of the sample tube is closed when the proper pressure is reached in the cavity. To reduce the pressure in the cavity, nitrous oxide can be recycled into the sample tube by immersing it in a bath of liquid nitrogen. This method allows for a slow rise of the pressure in the cavity and for reusing of the gas between experiments. Other methods, such as using a variable leak valve, would allow for precise pressure control but would not allow for reusing of the gas.

C. Measuring the THz Laser Output

Once the QCL was tuned into an absorption line and its emission frequency was confirmed, IR radiation passed through a hole in an off-axis parabolic mirror, through a ZnSe window at Brewster's angle, and through a 1 mm diameter pinhole into the laser cavity containing the molecular gas. Then, the back-mirror of the THz cavity was moved until lasing began and THz intensity was measured by the detector. Schottky diode detectors used for that purpose were Virginia Diodes, Inc. Zero Bias detectors (ZBD) with waveguide sizes WR3.4, WR2.2, WR1.5, WR1.2, and WR1.0 depending on the targeted emission frequency. The signal from the detector was amplified using a low-noise voltage amplifier (Stanford research SR560). The amplification factor was typically set between 5000 and 20,000.

The power output of the laser was measured using a calibrated power meter THZ5B-BL-DZ-DO from Gentec electro-optics.

The spectral lines of the THz laser were measured using a receiver and mixer from Virginia Diodes. The WR2.2 receiver, covering 300 GHz to 550 GHz operated with a multiplier factor of 36 with a local oscillator (LO) power of 10 dBm. The WR1.5 receiver, covering 550 GHz to 775 GHz operated with a multiplier factor of 54 with an LO power of 15 dBm. The signal generator providing the LO signal was a Hittite HMC-T2240. The intermediate frequency (IF) was measured on an Agilent E4448A spectrum analyzer.

Figure 5:
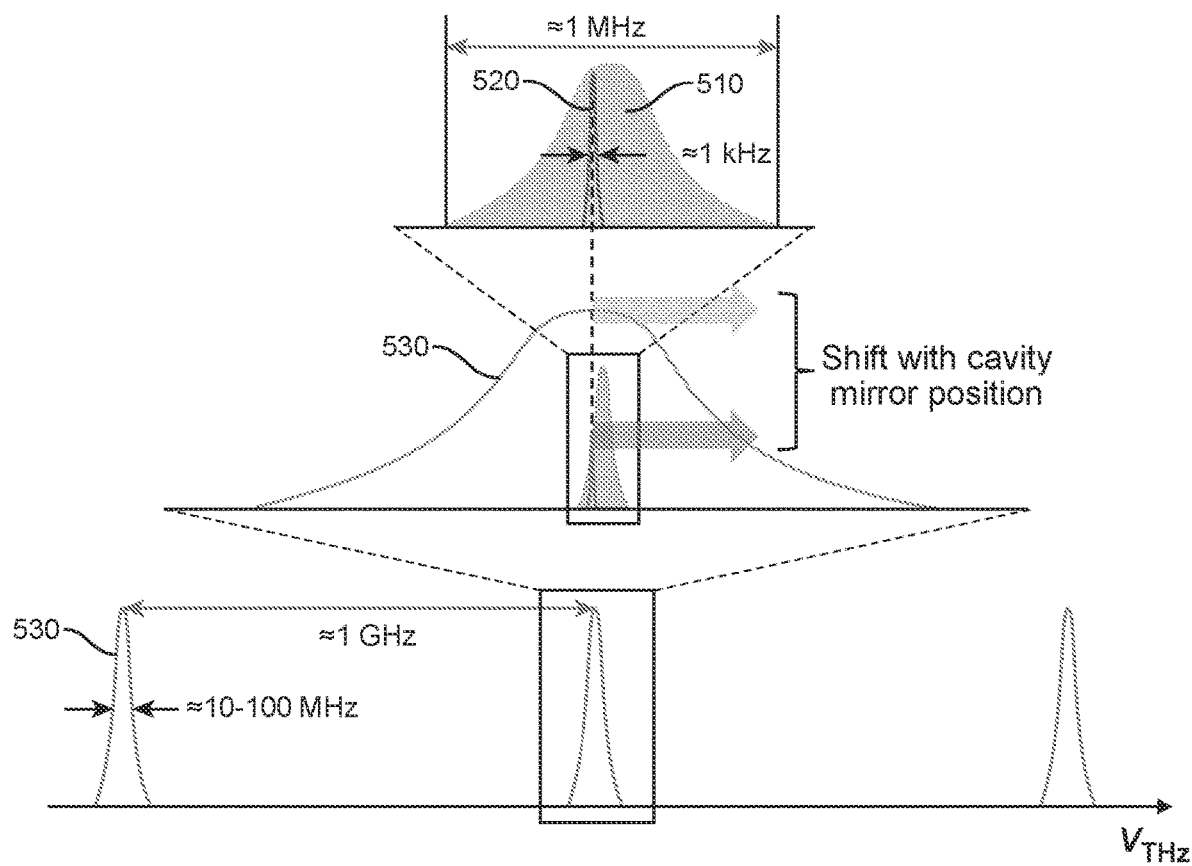
FIG. 5 is a schematic diagram illustrating a tuning range of a laser for a given pumped transition, according to an example embodiment.

FIG. 5 shows the tuning range of the THz laser for a given pumped transition. As the back-mirror of the gas cavity is translated, the free spectral range of the resonator is modified, resulting in a shift of the cavity modes 530. This in turn causes the emission frequency of the laser to shift within the frequency range of the molecular gain profile 510. To obtain the molecular gain profile of the THz laser at a given pumped transition, the emission frequency of the laser was measured for different positions of the back-mirror. In various embodiments, the tuning range includes THz laser line 520. The free spectral range of the 15 cm long Fabry-Perot cavity is of the order of 1 GHz. As the absolute position of the mirror increases, the length of the cavity decreases and the cavity mode ($\approx$10-100 MHz linewidth) is shifted toward higher frequencies (FIG. 5). This in turn shifts the laser frequency, which is such to minimize the cavity losses and maximize the gain. In FIG. 4B, the emission frequency of the laser is plotted 410 as a function of the position of the back-mirror. Since laser emission can only happen while a cavity mode overlaps with the gain profile of the pumped transition, this measurement gives the tuning range of the QPML ($\approx$1 MHz) for a given transition, as shown by the grey curve of FIG. 2E of the manuscript.

II. Theoretical Modeling

In the main text above, a simple model is presented to describe the lasing behavior at low pressures with negligible intermolecular collisional transition rates. In order to fully understand it across all pressures, herein is developed a more comprehensive model that thoroughly captures the collisional physics and can accurately predict the performance of QPMLs. In the model, rate equations of the population density of vibrational and rotational levels are solved numerically, and then the THz output power is computed based on the population inversions obtained from the rate equations when the QCL pump creates nonequilibrium populations. In various embodiments, a population inversion (e.g., a rotational population inversion, etc.) refers to a state in which more members of the system are in excited states than in lower energy unexcited states. For example, a rotational population inversion may be represented by a system in which an upper rotational state has more population than a lower rotational state.

For the $N_2O$ laser, the model includes $J_L+8$ rotational levels and the 10 lowest energy vibrational levels. The rate equations for the rotational levels are $$\frac{dN_l(v, r, t)}{dt} = \left[\sum_{l'=l\pm1} -\gamma_{ll'}N_l(v, r, t) + \gamma_{l'l}N_{l'}(v, r, t)\right] - \quad (S1)$$
$$\gamma_{SPT}N_l(v, r, t) + R_{pump}(v, r, t) + D\nabla^2 N_l(v, r, t)$$

where $N_l(v, r, t)$ is the nonthermal population density for rotational level l with axial velocity v along the pump beam direction, at position r, and at time t. $\gamma_{ll'}$ is the dipole-dipole collisional transition rate. From the selection rules, l' can only be l±1. The transition rate is determined by $\gamma_{ll'}=n_{tot}\langle v_{rel}\rangle\sigma P_{ll'}$, where $n_{tot}$ is the total molecular population density, $\langle v_{rel}\rangle$ is the thermally averaged relative velocity, $P_{ll'}$ is the appropriate branching ratio with Boltzmann factor, and a is the collisional cross section for the transition. In gas phase OPFIR lasers, the dominant collision is the dipole-dipole collision, so that $\sigma \infty \sigma_{DD}$. In the second line of Eq. (S1), $(-\gamma_{SPT}N_l)$ describes the thermalization transition of rotational level l into its vibrational mode due to low energy collisions. The thermalization rate $\gamma_{SPT}$ is computed from the gas kinetic cross section $\sigma_{GK}=15$ Å$^2$. $R_{pump}$ describes the pump transition thoroughly. It includes inhomogeneous broadening from different velocity subclasses with the Doppler effect, pressure broadening with HWHM equal to 4.0 MHz/Torr, and the multiple round-trips inside the cavity. The linewidth of the pump EC-QCL used in experiments is typically a few MHz. The detailed formula for $R_{pump}$ can be found in Ref 22. Diffusion is also included in the last term of Eq. (S1).

Similarly, the rate equations for the vibrational levels are $$\frac{dN_p(v, r, t)}{dt} = \left[\sum_{p'=p\pm1} -\gamma_{pp'}N_p(v, r, t) + \gamma_{p'p}N_{p'}(v, r, t)\right] + \quad (S2)$$
$$\sum_l \gamma_{SPT}\int dv N_l(v, r, t) + D\nabla^2 N_p(v, r, t)$$

in which $\gamma_{pp'}$ is the transition rate between vibrational thermal pools p→p' and is assumed proportional to the gas kinetic cross section $\sigma_{GK}$ and Boltzmann factor $\exp(-\Delta E_{pp'}/k_B T)$ where $E_{pp'}$ is the vibrational energy difference between p and p'. The last two terms describe the thermalization from rotational levels to vibrational levels as well as diffusion.

Molecule-wall collisions are modeled by a reaction boundary condition [22] so that wall collisions thermalize the vibrational levels and redistribute the molecules into all possible levels with a Boltzmann distribution at room temperature (300K). The ground vibrational state has the largest occupation probability.

One can obtain the steady state by setting dN/dt=0. These nonlinear rate equations are discretized and solved numerically by fixed-point iteration with Anderson Acceleration. At each iteration step, the MUMPs direct solver (MUltifrontal Massively Parallel Sparse direct Solver) is used for factorizing the sparse matrix.

THz output power is then obtained by matching the cavity loss $\alpha_{cell}$ with the THz gain. In particular, the cavity loss includes Ohmic loss $\alpha_{ohmic}$ and transmission loss through the front window $\alpha_{trans}$. Ohmic loss can be expressed analytically for the modes of a hollow metal waveguide, which increases strongly with decreasing radius. The transmission loss is estimated by $\alpha_{trans} = -\log(1-T)/2L$ where T is the front window transmission coefficient and L is the cavity length. The gain coefficient is obtained by integrating contributions from all velocity subclasses.

III. Determination of $\sigma_{DD}$ and Other Parameters

Unlike widely-studied CH$_3$F, whose collisional parameters are experimentally well known, many important collisional cross sections of N$_2$O are unknown, such as the most important $\sigma_{DD}$ (dipole-dipole collisions). However, thanks to the completeness of the OPFIR model, one can use the experimental results to extract a few key unknowns by a fitting procedure. In particular, one can use experimental fits to recover the dipole-dipole cross section $\sigma_{DD}$, the cavity loss (since the alignment and other geometric factors were imperfectly known for the cavity), and the QCL linewidth. The numerical modeling finds that the output power is insensitive to the gas kinetic collisional cross section, so $\sigma_{GK}$ is fixed as 15 Å$^2$ within reasonable range. Once these parameters were obtained, one could then proceed to use the model to predict other lasing behaviors and to identify the optimal cavity and operating regime.

Figure 6:
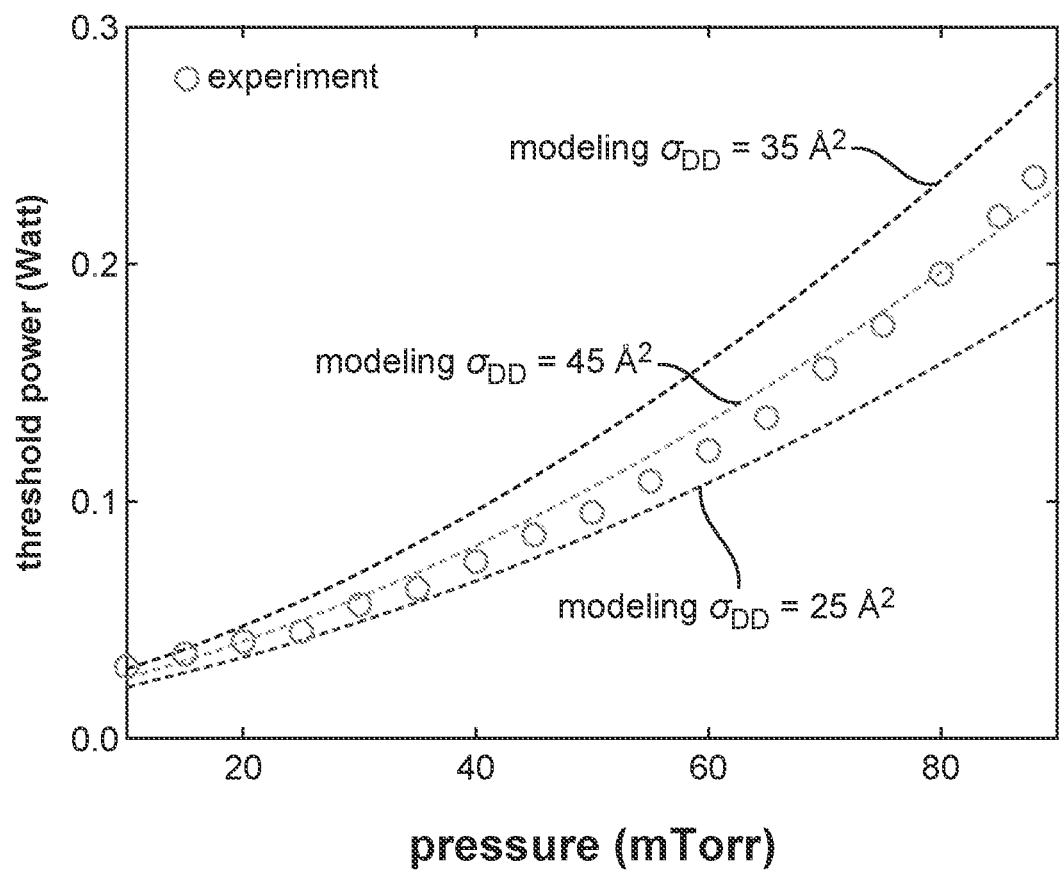
FIG. 6 is a graph illustrating threshold power for a direct lasing transition, according to an example embodiment.

FIG. 6 shows threshold power for the direct lasing transition as a function of pressure for $J_L=14$. Results from experimental measurement (circles) and theoretical modeling (dashed lines) with different values of $\sigma_{DD}=25$ Å$^2$, 35 Å$^2$, and 45 Å$^2$ are compared. In the model, the cavity loss is a fitting parameter (0.3 m$^{-1}$). The results imply that the dipole-dipole cross section of N$_2$O is $\sigma_{DD}=35$ Å$^2$. A reasonable range for $\sigma_{DD}$ can be estimated by assuming $\sigma_{DD}$ proportional to the dipole moment µ of the molecule. Consider:

$$\mu_{N_2O} = 0.17 D, \mu_{CH_3F} = 1.8 D,$$

$$\text{and } \sigma_{DD}^{CH_3F} = 320 \text{Å}^2, \sigma_{DD}^{N_2O} \approx \sigma_{DD}^{CH_3F} \frac{\mu_{N_2O}}{\mu_{CH_3F}} = 30 \text{Å}^2.$$

FIG. 6 shows that $\sigma_{DD}=35$ Å$^2$ gives the best agreement with experiments, which is also within the reasonable range. The cavity loss from the fitting is 0.3 m$^{-1}$, which is about 5 times larger than an ideal cylindrical cavity operating on the TE$_{01}$ mode. In principle, cavity loss can be computed with the exact cavity geometry and cavity mode. However, the current cavity has poor alignment using a concave back mirror with focal length about 2-3 cm, which readily couples the lasing mode to other cavity modes. In addition, the front pinhole coupler is tapered from the 1 mm diameter exit to the 5 mm diameter cavity, and this taper also contributes to mode mixing while suppressing long wavelength emission below cutoff. QCL linewidth is fitted as 2 MHz to match FIG. 2C with FIG. 2D in the main text, a value that is well within the range previously reported for EC-QCLs.

Figure 7:
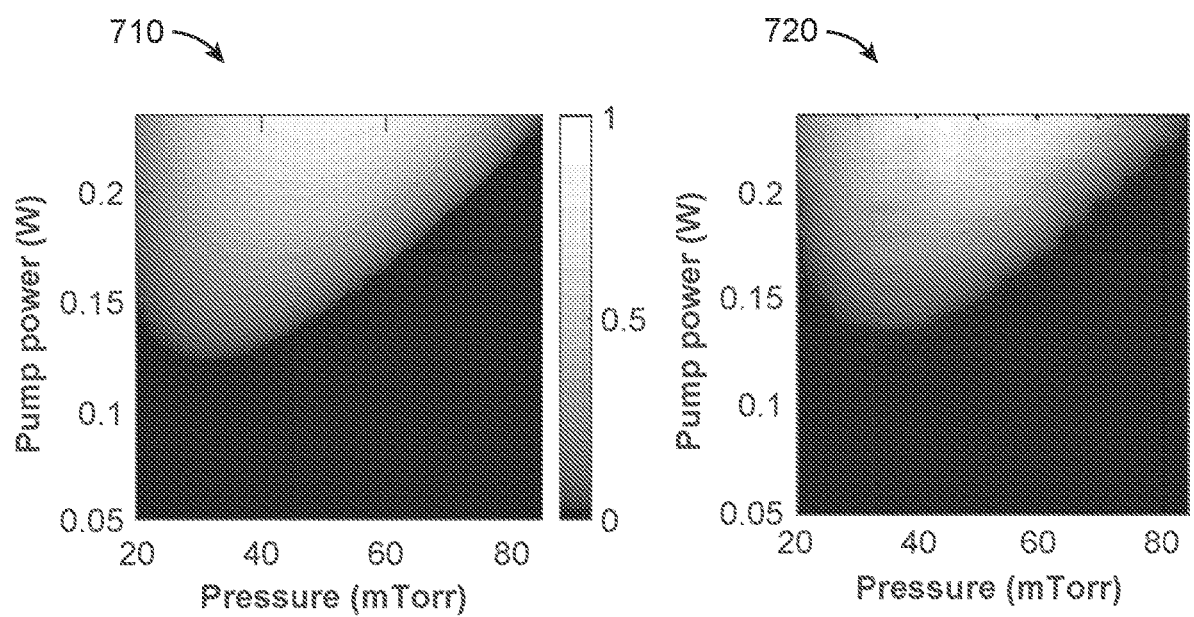
FIG. 7 illustrates contour plots of predicted and measured output power from lasing transitions, according to an example embodiment.

FIG. 7 shows a contour plot of the THz output power from direct lasing transition as a function of pressure and pump power for $J_L=31$. The theoretical prediction 710 (left) matches the experimental measurement 720 (right) very well with previously obtained dipole-dipole collisional cross section $\sigma_{DD}=35$ Å$^2$, and QCL linewidth of 2 MHz. The cavity loss is a fitting parameter (0.46 m$^{-1}$). The agreement between theoretical modeling and experiments confirms the correctness of the deduced collisional cross sections and QCL linewidth. Only the cavity loss had to be adjusted, increased to 0.46 m$^{-1}$ at this higher frequency to obtain good agreement. A frequency-dependent cavity loss is expected because of the increasing number of modes above cutoff at higher frequencies, which are coupled more easily to the lasing mode by the concave back plunger in the cavity with increasing $J_L$ and lasing frequency. There is potential for improving the cavity design with a different geometry mirror or metasurface.

IV. Output and Threshold Power for Different Transitions

Figure 8A:
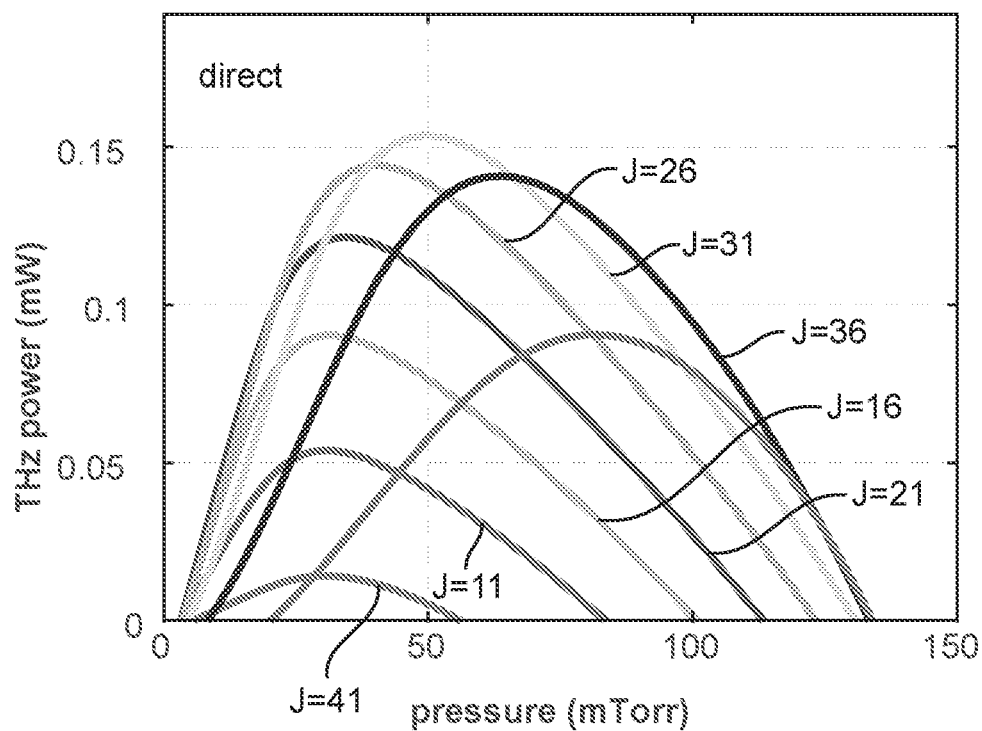
FIGS. 8A and 8B are graphs illustrating predicted THz output power versus pressure, according to an example embodiment.
Figure 8B:
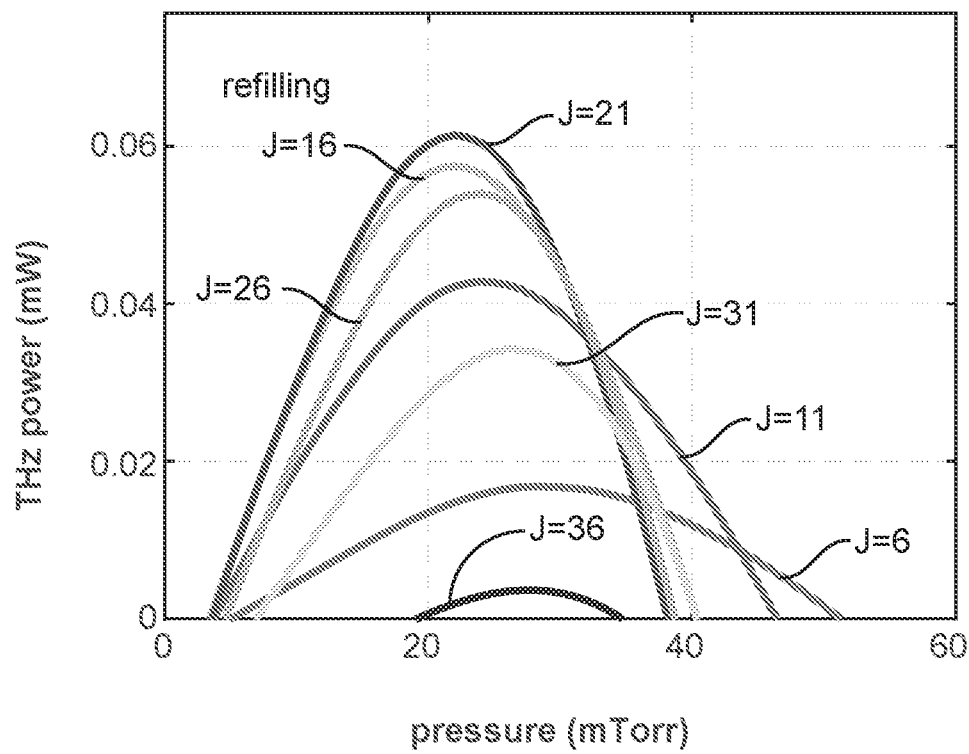

FIG. 8A shows THz output power vs pressure with JL=6 to JL=41 for direct lasing, and FIG. 8B shows THz output power vs pressure for refilling lasing. FIG. 6 indicates that the pump threshold power increases with pressure, but this doesn't imply higher powers at lower pressures, because only a limited pressure-broadened velocity subclass fraction of the JL population can be pumped. The optimal pressure with the highest output power occurs in between, as shown in FIG. 8A and FIG. 8B for both direct and refilling lasing with JL=6 (~175 GHz) to JL=41 (~1.05 THz). The peak powers for different transitions at the optimal pressures are plotted in the main text FIG. 3C. The comprehensive model predicts the direct transition with JL=28 produces the highest power. This is slightly different from the simple model prediction where the peak power appears for the transition with JL=21, as shown in FIG. 1B. The discrepancy is caused by the low pressure limitation of the simple model. In FIG. 1B, the gas pressure was fixed at 20 mTorr within the valid region of the simple model, while the comprehensive model implies that the optimal pressures are typically above 40 mTorr. In fact, FIG. 8A confirms that at 20 mTorr the transition with JL=21 has the highest power. Furthermore, lasing from direct inversion operates at higher pressures and with much more THz power than lasing from refilling inversion because the latter must overcome the effect of a much greater thermal population in the ground vibrational state that causes a greater threshold pump power.

Figure 9:
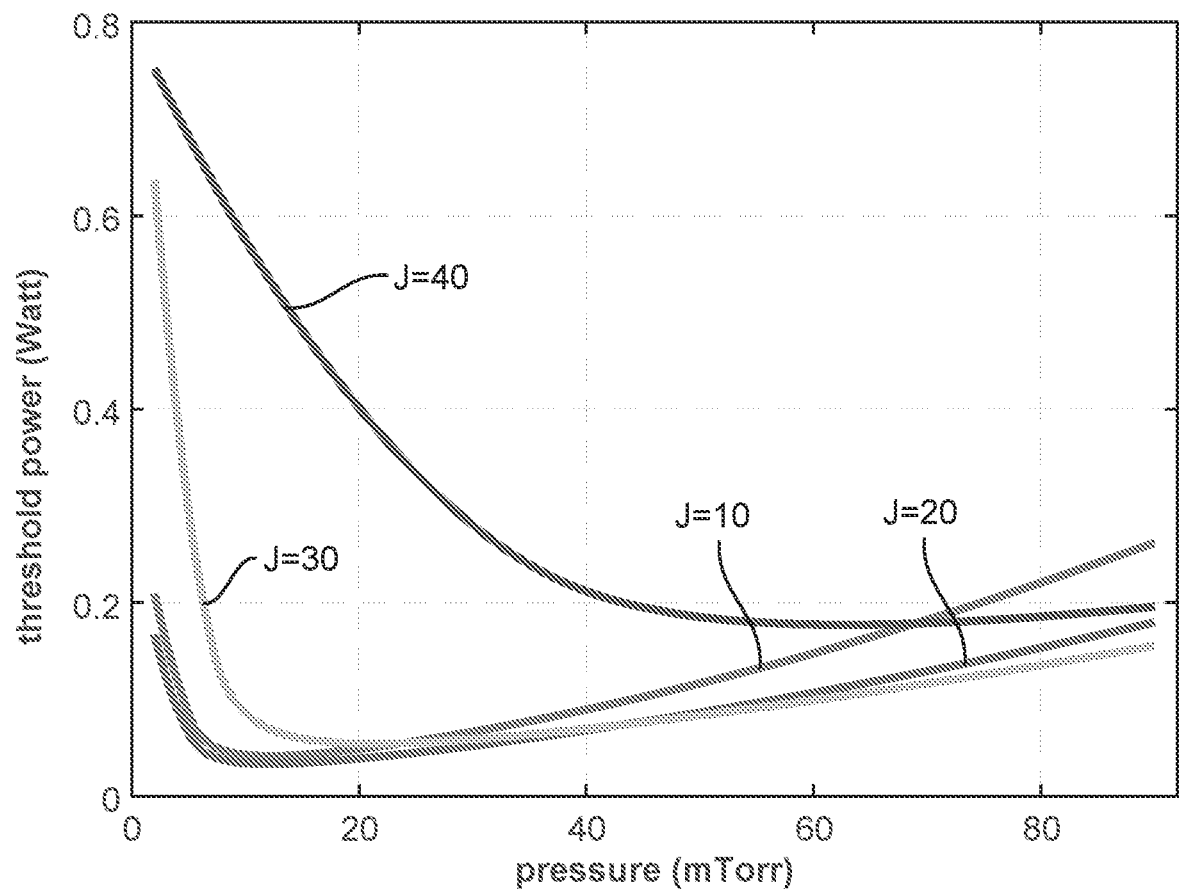
FIG. 9 is a graph illustrating predicted pump threshold power as a function of pressure, according to an example embodiment.

FIG. 9 shows pump threshold power as a function of pressure for $J_L=10, 20, 30, 40$. The cavity loss is assumed to be 0.3 m$^{-1}$ for all cases. $J_L=30$ has the lowest threshold across all pressures above 40 mTorr where optimal pressure appears as shown in FIG. 8A. This corresponds to the observation in the main text (FIG. 3B) that $J_L=28$ is predicted to produce the maximum power, even though the maximum population occurs at $J_L=15$, because of the Manley-Rowe effect. A rotational state with a larger or smaller $J_L$ has a smaller population available to be pumped and therefore can produce smaller output power with a higher threshold. For $J_L=40$, the threshold power increases with decreasing pressure below 60 mTorr. This is also an effect of a very limited population available to be pumped since the population fraction is only $n_{J=40}=0.54\%$.

V. Analytic Derivation of Threshold and Output Powers

Figure 10:
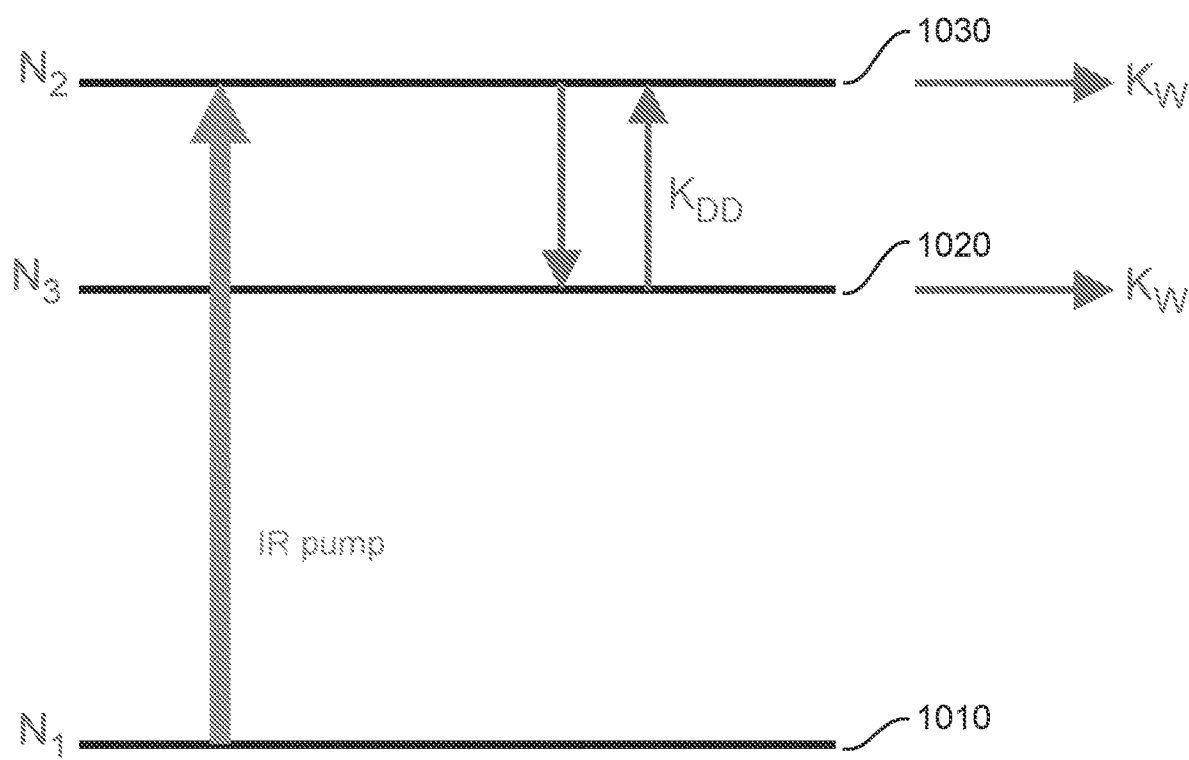
FIG. 10 is a schematic illustration of a simplified three-level model for analytical derivations, according to an example embodiment.

FIG. 10 shows a simplified three-level model for analytical derivations. In a simplified three-level model as shown in FIG. 10, population in the ground level one 1010 is pumped with rate R$_{pump}$ into level 2, followed by dipole-dipole collisions between level two 1030 and level three 1020 and collisions with the cavity wall. THz lasing occurs between level two 1030 and level three 1020. Note that the spontaneous emission is not used for obtaining the population inversion, because in the collision-dominant molecular gas lasers the spontaneous emission rate ($1/t_{sp} \sim 10^{-5}$ s$^{-1}$) is negligible compared with the dipole-dipole collision rate ($k_{DD} \sim 10^5$ s$^{-1}$). Spontaneous emission rate between level two 1030 and level three 1020 is used only for the gain calculation. In this section, analytical derivations of the population inversion, gain coefficient, pump threshold, and the THz output power in the low-pressure limit are presented.

A. Pump Threshold

Assuming molecular relaxation is dominated by molecule-wall collisions with rate $k_w$, and intermolecular dipole-dipole collisions with rate $k_{DD}$, the rate equations for $N_2$ and $N_3$ are $$\frac{dN_2}{dt} = R_{pump} - N_2(k_{DD} + k_w) + N_3 k_{DD}, \quad \frac{dN_3}{dt} = N_2 k_{DD} - N_3(k_{DD} + k_w)$$

At steady state, $$\frac{dN_2}{dt} = \frac{dN_3}{dt} = 0,$$

and the population inversion is obtained as $$\Delta N = N_2 - N_3 = \frac{R_{pump}}{2k_{DD} + k_w}. \tag{S3}$$

The pump rate can be approximated as $$R_{pump} = \frac{P_{QCL}(\alpha_{IR}L)}{h\nu_{IR}} \frac{1}{\pi R_{cell}^2 L} = \frac{\alpha_{IR} P_{QCL}}{\pi R_{cell}^2 h\nu_{IR}} \tag{S4}$$

in which $\alpha_{IR}$ is the infrared absorption coefficient of the gain medium, and $R_{cell}$ and L are the cavity radius and length, respectively. The pump power absorbed by the gain medium is approximated as $P_{QCL}(\alpha_{IR}L)$.

The unsaturated gain coefficient is $$\gamma_0 = \sigma \Delta N = \left[\frac{\lambda^2}{8\pi^2 \Delta\nu t_{sp}}\right] \Delta N$$

where $\sigma$ is the cross section for the lasing transition, the spontaneous emission lifetime is $$t_{sp} = \frac{3h\epsilon_0 \lambda^3}{16\pi^3 \mu_{ij}^2}$$

where $\mu_{ij}^2 = |\langle i|\mu|j\rangle|^2$ is the dipole matrix element, and $\Delta\nu$ is the half width at half maximum of the gain profile approximated in this low pressure regime as the Doppler broadening half width $$\Delta\nu \approx \Delta\nu_D \approx \frac{u}{\lambda}$$

where u is me average absolute molecular velocity. With temperature T and molecular mass m, $$u = \sqrt{\frac{8k_B T}{\pi m}}.$$

Then one obtains $$\gamma_0 = \left(\frac{2}{3h^2 \epsilon_0}\right)\left(\frac{\mu_{ij}^2}{u R_{cell}^2}\right)\left(\frac{\alpha_{IR} P_{QCL}}{\nu_{IR}}\right)\frac{1}{2k_{DD} + k_w}. \tag{S5}$$

Threshold occurs when the unsaturated gain coefficient is equal to the cell loss, $\gamma_0 = \alpha_{cell}$, and the threshold power can be derived as $$P_{th} = \left(\frac{3h^2 \epsilon_0 \nu_{IR}}{2}\right)\left(\frac{u R_{cell}^2}{\mu_{ij}^2}\right)\left(\frac{\alpha_{cell}}{\alpha_{IR}}\right)(2k_{DD} + k_w) \tag{S6}$$

At low pressures where molecule-wall collisions dominate, $$k_w \gg k_{DD}, \quad k_w \approx \frac{2u}{3R},$$

and the pump threshold simplifies to $$P_{th} = \left(h^2 \epsilon_0 \nu_{IR}\right)\left(\frac{u^2 R_{cell}}{\mu_{ij}^2}\right)\left(\frac{\alpha_{cell}}{\alpha_{IR}}\right). \tag{S7}$$

The above derivations are in SI units. The dipole moment is to be converted by 1 Debye=$3.33564 \times 10^{-30}$ C m. In Electrostatic CGS unit, Eq. (S7) is written as Eq. (2) in the main text by replacing $\epsilon_0$ with $1/4\pi$.

B. THz Output Power

Output power is obtained by equating the saturated gain to the cavity loss, $$\gamma = \frac{\gamma_0}{1 + \frac{\Phi}{\Phi_s}} = \alpha_{cell} \tag{S8}$$

in which $\Phi$ is the photon flux density that is proportional to THz output power $P_{THz}$:

$$P_{THz} = \frac{1}{2} h\nu_{THz} T(\pi R_{cell}^2)\Phi = \frac{1}{2} h\nu_{THz} T(\pi R_{cell}^2)\left(\frac{\gamma_0}{\alpha_{cell}} - 1\right)\Phi_s \tag{S9}$$

where $R_{cell}$ is the cavity radius, $$\Phi_s = \frac{k_s \Delta N}{\gamma_0}$$

is the saturated photon flux density, and T is the power transmission coefficient of the front coupler. For wavelengths smaller than the pinhole diameter $\lambda_{THz} < 2r_0$, T can be approximated as $$T \approx \left(\frac{r_0}{R_{cell}}\right)^2,$$

but if the lasing wavelength is larger than $2r_0$, T depends sensitively on the pinhole thickness. In the simple 3-level model, $k_s$ can be derived as $$k_s = \frac{(2k_{DD} + k_w)}{2}$$

following Ref. 35, and one obtains $$P_{THz} = \frac{1}{2}h\nu_{THz}(\pi r_0^2)\left(\frac{1}{\alpha_{cell}} - \frac{1}{\gamma_0}\right)\frac{\alpha_{IR}P_{QCL}}{2\pi R_{cell}^2 h\nu_{IR}} = \quad (S10)$$

$$\frac{1}{4}\frac{\nu_{THz}}{\nu_{IR}}\frac{r_0^2}{R_{cell}^2}\frac{\alpha_{IR}}{\alpha_{cell}}\left(1 - \frac{\alpha_{cell}}{\gamma_0}\right)P_{QCL} = \frac{1}{4}\frac{\nu_{THz}}{\nu_{IR}}\frac{r_0^2}{R_{cell}^2}\frac{\alpha_{IR}}{\alpha_{cell}}(P_{QCL} - P_{th}).$$

Relationship $$\frac{P_{th}}{\alpha_{cell}} = \frac{P_{QCL}}{\gamma_0}$$

is used in the above derivation. The power efficiency equals the derivative of $P_{THz}$ with respect to the pump power:

$$\eta = \frac{1}{4}\frac{\nu_{THz}}{\nu_{IR}}\frac{r_0^2}{R_{cell}^2}\frac{\alpha_{IR}}{\alpha_{cell}}. \quad (S11)$$

Here are a few direct observations. The output power and power efficiency are proportional to the IR absorption coefficient $\alpha_{IR}$. Since $\alpha_{IR}$ is proportional to the molecular pressure p and the population fraction of rotational level $J_L$, one has $P_{THz}$, $\eta \propto \alpha_{IR} \propto pn_{JL}$. The output power and power efficiency are also proportional to the THz frequency, i.e., $P_{THz}$, $$\eta \propto \frac{\nu_{THz}}{\nu_{IR}},$$

which is the Manley-Rowe effect.

In this derivation, it was assumed that the linewidth of the QCL was much narrower than the Doppler width of the pumped infrared transition, and indeed this is the case. The experimental QCL is specified by the manufacturer to have a linewidth in the range of 1-10 MHz also confirmed by other measurements compared to the 50-150 MHz linewidth of typical molecular infrared transitions. The analysis finds excellent agreement with the experimental results for a QCL linewidth of 2 MHz. If the QCL linewidth were larger, the simple model derived here could reflect this fact by using an averaged $\alpha_{IR}$, obtained by a convolution of the QCL and Doppler lineshapes, rather than using the above approximation of $\alpha_{IR}$ at its center frequency. Regarding the linewidth of the QPML laser transition, these lasers are perhaps more appropriately called "masers" because their cavity linewidths ($\infty$10-100 MHz) are larger than the molecular gain profile ($\infty$1 MHz).

Figure 11:
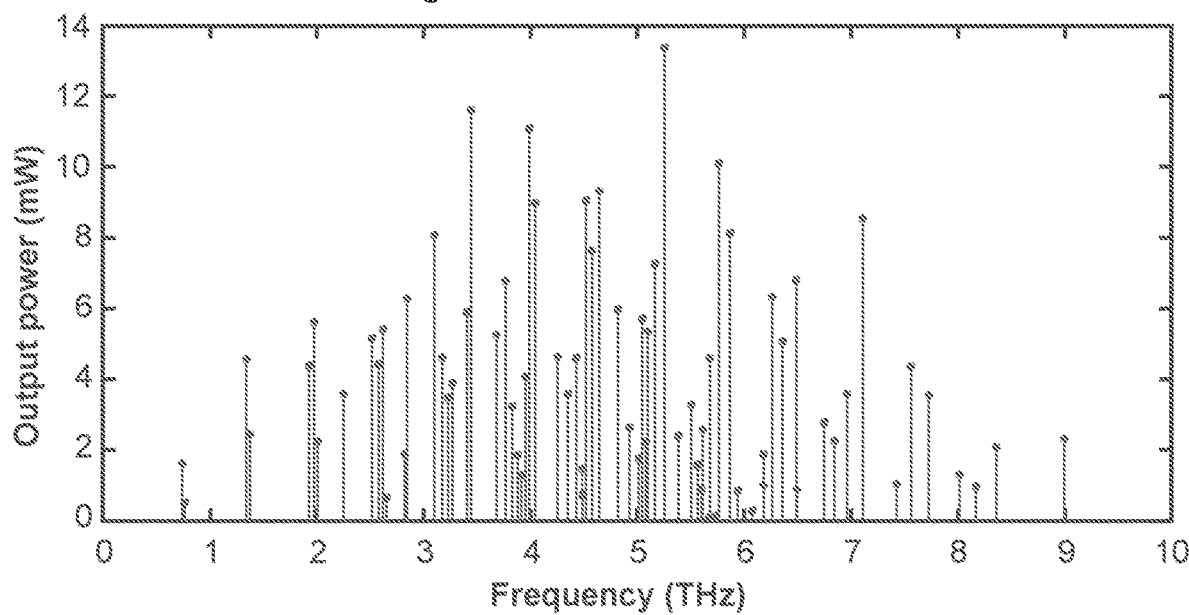
FIG. 11 illustrates output power of a QCL-pumped $NH_3$ laser, lasing on rotation-inversion transitions, according to an example embodiment.
Figure 12:
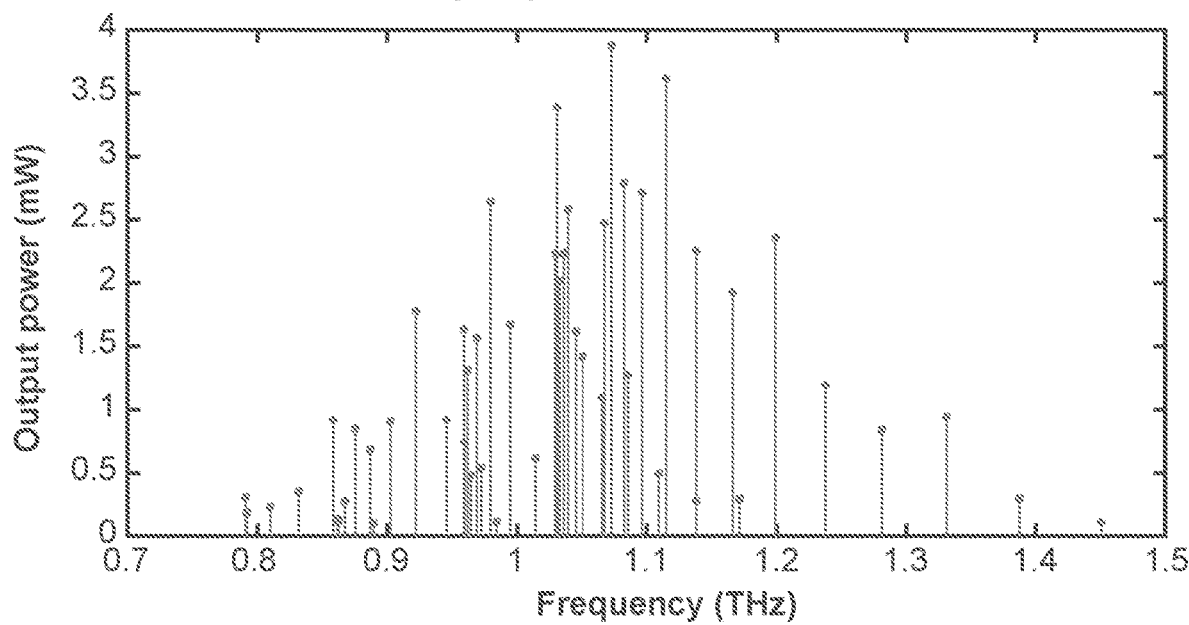
FIG. 12 illustrates output power of a QCL-pumped $NH_3$ laser, lasing on pure inversion transitions, according to an example embodiment.

The oblate molecule ammonia ($NH_3$) combines many of the most attractive attributes for QPML operation: a low lying vibrational mode with a strong IR absorption coefficient and a large permanent dipole moment. Consequently, the simple model predicts that it can have low threshold and high power efficiency, attributes that may produce the strongest lines of the nine molecules considered here. Note that unlike the ground state inversion, which occurs at a relatively low frequency of 24 GHz, the inversion splitting in $v_2=1$ vibrational mode near 950 $cm^{-1}$ is much larger, approximately 1 THz. FIG. 11 and FIG. 12 plot the emission frequency and power predicted by the simple model for 20 mTorr of ammonia in a compact cylindrical cavity pumped by a 1 W QCL for emission frequency between 0 and 10 THz. FIG. 11 plots the predicted laser lines for the strongest rotation-inversion transitions in $NH_3$ and FIG. 12 plots the predicted laser lines for the strongest pure-inversion transitions in $NH_3$, spanning transitions up to J=9 excited by Q-branch transitions between 930-936 $cm^{-1}$ and 962-968 $cm^{-1}$. The strongest laser lines are those for which J=K or K-1. Operation on several of pure-inversion lines near 1 THz has recently been experimentally shown but the limited tuning range of pure inversion transitions minimizes the effectiveness of the Manley-Rowe factor.

Figure 13A:
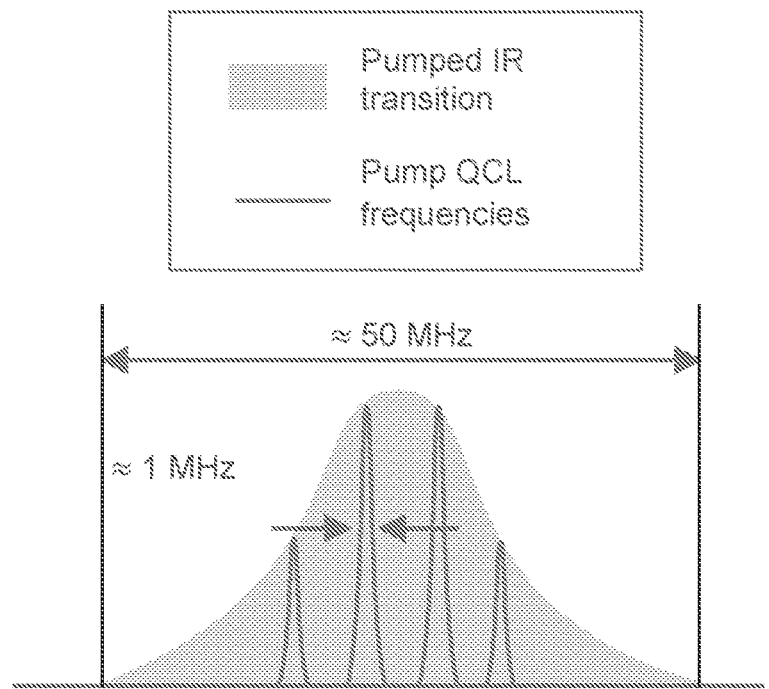
FIG. 13A is a graph illustrating emission frequencies for a pumped transition, according to an example embodiment.
Figure 13B:
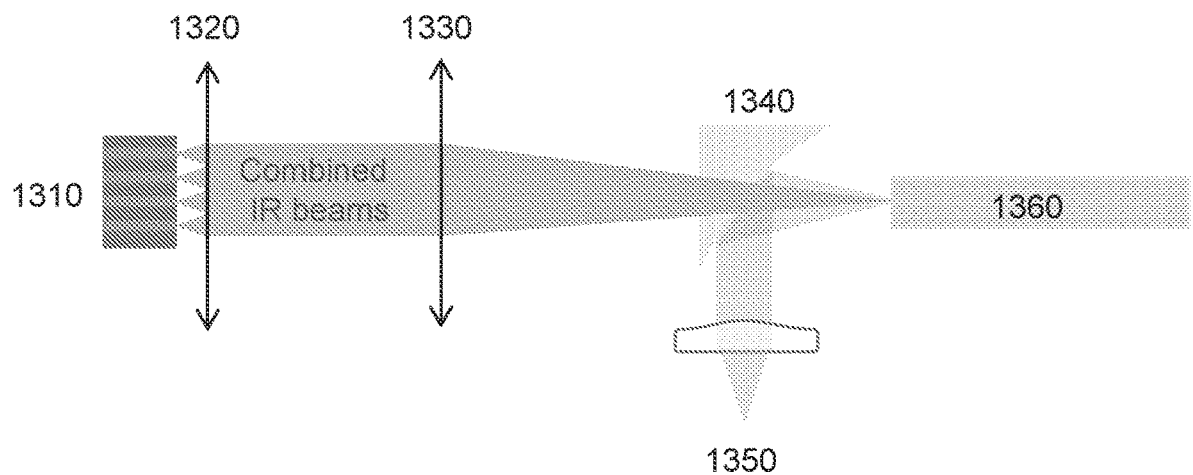
FIG. 13B illustrates a system to further increase THz output power, according to an example embodiment.

The infrared pump laser of the QPML is not required to be implemented by a single laser device. If two QCLs with a linewidth narrower (typically between 1 MHz and 10 MHz) than the width of the pumped infrared transition can be tuned into roughly the same frequency of an IR transition, then combining their beams in the QPML cavity can increase the THz output power. It is not required that the two QCLs are coherently combined and locked in frequency. On the contrary, the power increase from the combination of the two QCLs may require that the two lasers pump different parts of the IR transition, and is to be separated in frequency roughly by their linewidth. By extension, this scheme can be scaled up with as many devices required to pump the full width of the IR transition (Doppler broadened, or pressure broadened depending on the pressure regime the QPML is operating at), see FIG. 13A for an example of how QCL frequencies can fill the pumped IR transition. The challenge when using many QCL devices is how to efficiently combine the two QCL beams into a single beam that pumps the QPML cavity, as the introduction of beam splitter and beam combiner can create additional and unnecessary losses. When only two devices are used a solution could be to inject the IR beam from the different devices at different angles. Another solution when using more than one device, is to integrate distributed feedback (DFB) single mode QCLs 1310 as an array of lasers: using appropriate optics 1320 and 1330 (e.g., beam combining optics, coupling optics, etc.) the beams emanating from the different devices can be combined into a single beam that can pump the QPML 1360 (see. FIG. 13B for an example of how this could be implemented with a DFB QCL 1310). In various embodiments, the single beam may be directed using OAP 1340 with THz output 1350.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal to each other if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A laser system, comprising:
   a first laser comprising:
      a laser cavity; and
      a gas phase molecular gain medium disposed in the laser cavity, the gas phase molecular gain medium having an absorption band; and
   a second laser, wherein:
      the second laser is a solid-state laser configured to be continuously tunable, with respect to an emission wavelength of the second laser, over the absorption band of the gain medium; and
      the second laser is tuned to pump rotational vibrational transitions in the gas phase molecular gain medium to achieve a rotational type of population inversion.

2. The laser system of claim 1, wherein the rotational type of population inversion is achieved on a ground vibrational level.

3. The laser system of claim 1, wherein the rotational type of population inversion is achieved on an upper vibrational level.

4. The laser system of claim 1, wherein the gas phase molecular gain medium comprises a molecule with a permanent dipole moment and a non-zero vapor pressure.

5. The laser system of claim 1, wherein the gas phase molecular gain medium comprises a gas including at least one of: nitrous oxide ($N_2O$), carbonyl sulfide (OCS), hydrogen cyanide (HCN), ammonia ($NH_3$), methyl fluoride ($CH_3F$), methyl chloride ($CH_3Cl$), methanol ($CH_3OH$), or carbon monoxide (CO).

6. The laser system of claim 1, wherein the gas phase molecular gain medium comprises a mixture of gases.

7. The laser system of claim 1, wherein the gas phase molecular gain medium comprises ammonia ($NH_3$), wherein the second laser is tuned to pump the rotational vibrational transitions in the ammonia to achieve population inversion corresponding to pure inversion or rotation-inversion transitions, and wherein the laser system is configured to emit light at a frequency above 1.2 terahertz (THz).

8. The laser system of claim 1, wherein the gas phase molecular gain medium comprises ammonia ($NH_3$), wherein the second laser is tuned to pump the rotational vibrational transitions in the ammonia to achieve population inversion corresponding to pure inversion or rotation-inversion transitions, and wherein the laser system is configured to emit light at a frequency below 700 GHz.

9. The laser system of claim 1, wherein the second laser is configured to be tuned using a process for creating the rotational type of population inversion.

10. The laser system of claim 1, wherein the absorption band comprises an entire span of a P-, Q-, or R-branch rotational-vibrational spectrum of the gas phase molecular gain medium.

11. The laser system of claim 1, wherein the first laser is tuned to emit on any rotational absorption line of the gas phase molecular gain medium.

12. The laser system of claim 1, wherein the laser system is configured to provide laser lines spanning a full rotational spectrum of the gas phase molecular gain medium by selectively creating the rotational type of population inversion on any of the rotational vibrational transitions through selective optical pumping by the second laser.

13. The laser system of claim 1, wherein the first laser is configured to provide laser lines from the rotational type of population inversion with powers dependent on a pumping power of the second laser, a pressure of the gain medium, and a geometry of the laser cavity.

14. The laser system of claim 1, wherein the second laser is one of a semiconductor laser or a fiber laser.

15. The laser system of claim 1, wherein the second laser is a quantum cascade laser.

16. The laser system of claim 1, wherein the second laser is one of an interband cascade laser or a III-V semiconductor laser.

17. The laser system of claim 1, wherein the first laser comprises a first quantum cascade laser device and a second quantum cascade laser device that are power-combined into a laser cavity of the second laser and tuned at substantially identical frequencies to increase a terahertz (THz) output power of the laser system.

18. The laser system of claim 1, wherein the first laser is an array of multiple distributed feedback quantum cascade lasers, wherein beams from the array are combined into a cavity of the second laser to increase a terahertz (THz) output power of the laser system.

19. A method of using a laser system, comprising:
   providing a first laser comprising a laser cavity and a gas phase molecular gain medium disposed in the laser cavity, the gas phase molecular gain medium having an absorption band;
   tuning a second laser over the absorption band to pump rotational vibrational transitions in the gas phase molecular gain medium, the second laser comprising a solid-state laser; and
   pumping the rotational vibrational transitions in the gas phase molecular gain medium of the first laser using the second laser to achieve a rotational type of population inversion in the gas phase molecular gain medium.

20. The method of claim 19, wherein the rotational type of population inversion is achieved on a ground vibrational level or an upper vibrational level.

\* \* \* \* \*